(12) United States Patent
Lin et al.

(10) Patent No.: US 12,136,379 B2
(45) Date of Patent: Nov. 5, 2024

(54) DISPLAY PANEL

(71) Applicant: AUO Corporation, Hsinchu (TW)

(72) Inventors: Chun-Yu Lin, Hsinchu (TW); Kun-Cheng Tien, Hsinchu (TW); Jia-Long Wu, Hsinchu (TW); Rong-Fu Lin, Hsinchu (TW); Shu-Hao Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/349,184

(22) Filed: Jul. 10, 2023

(65) Prior Publication Data

US 2023/0368720 A1   Nov. 16, 2023

Related U.S. Application Data

(63) Continuation-in-part of application No. 17/895,073, filed on Aug. 25, 2022, now Pat. No. 11,721,283.

(30) Foreign Application Priority Data

May 11, 2022   (TW) .................................. 111117634

(51) Int. Cl.
*G09G 3/20* (2006.01)

(52) U.S. Cl.
CPC ... *G09G 3/2092* (2013.01); *G09G 2300/0439* (2013.01); *G09G 2300/0469* (2013.01); *G09G 2310/0264* (2013.01)

(58) Field of Classification Search
CPC ......... G09G 3/2092; G09G 2300/0426; G09G 2300/0439; G09G 2300/0469; G09G 2310/0264; G09G 3/3208; H10K 59/131; H10K 2102/3031
See application file for complete search history.

(56) References Cited

U.S. PATENT DOCUMENTS

| 9,188,823 B2 | 11/2015 | Niioka et al. |
| 10,810,397 B2 | 10/2020 | Zeng et al. |

FOREIGN PATENT DOCUMENTS

| CN | 108269503 | | 7/2018 | |
| CN | 110767714 A | * | 2/2020 | ......... H01L 27/3244 |

* cited by examiner

Primary Examiner — Stacy Khoo
(74) Attorney, Agent, or Firm — JCIPRNET

(57) ABSTRACT

A display panel includes a plurality of driving electrode regions and a plurality of wiring regions connected between the driving electrode regions. A (2n−1)th wiring region extended from a (2n−1)th driving electrode region toward a (2n)th driving electrode region has a wiring extending direction forming a first included angle with an arrangement direction, and a (2n)th wiring region extended from the (2n)th driving electrode region toward a (2n+1)th driving electrode region has a wiring extending direction forming a second included angle with the arrangement direction, and a (2n+1)th wiring region extended from the (2n+1)th driving electrode region toward a (2n+2)th driving electrode region has a wiring extending direction forming a third included angle with the arrangement direction, wherein n is a positive integer. At least one of the first included angle, the second included angle and the third included angle is positive and at least one of them is negative.

19 Claims, 21 Drawing Sheets

DISPLAY PANEL

CROSS-REFERENCE TO RELATED APPLICATION

This application is a continuation-in-part application of and claims the priority benefit of U.S. patent application Ser. No. 17/895,073, filed on Aug. 25, 2022. The prior application Ser. No. 17/895,073 claims the priority benefit of Taiwan application serial no. 111117634, filed on May 11, 2022. The entirety of each of the above-mentioned patent applications is hereby incorporated by reference herein and made a part of this specification.

BACKGROUND OF THE INVENTION

Field of the Invention

The invention relates to a display device, and more particularly, to a display panel.

Description of Related Art

The transparent display panel is a display panel having a certain degree of transparency. The user may see the image information displayed on the transparent display panel, and may see the background information behind the transparent display panel. Transparent panels are suitable for a variety of scenarios such as vending machines, car windows, and shop windows. The transparent display panel generally adopts liquid-crystal display (LCD), organic light-emitting diode (OLED), or micro light-emitting diode (pLED) techniques.

In order to allow the user to receive the display information and the physical information of the background at the same time, the transparent display panel has an element setting region with low average optical transmission and a transmission region with high average optical transmission. The element setting region may be used for setting the driving electrodes of LCD or self-luminous diodes (for example, OLED or pLED) and related circuit wiring, and the transmission regions allow the user to receive the background behind the transparent display panel. Since the transmission regions are divided into a plurality of small transmission regions by the circuit wiring, this may lead to the generation of diffraction phenomenon and reduce image quality. Therefore, how to reduce the diffraction phenomenon in the transparent display panel and keep the transparency of the transparent display panel to a certain degree has become an urgent issue requiring immediate attention.

SUMMARY OF THE INVENTION

The invention provides a display panel that may improve first-order diffraction and the diffraction of high-frequency terms at the same time, so as to improve the image quality of the display panel.

A display panel of the invention includes a plurality of driving electrode regions and a plurality of wiring regions connected between the driving electrode regions. A (2n−1)th driving electrode region, a (2n)th driving electrode region, a (2n+1)th driving electrode region and a (2n+2)th driving electrode region are arranged in sequence along an arrangement direction, a (2n−1)th wiring region extended from the (2n−1)th driving electrode region toward the (2n)th driving electrode region has a wiring extending direction forming a first included angle with the arrangement direction, and a (2n)th wiring region extended from the (2n)th driving electrode region toward the (2n+1)th driving electrode region has a wiring extending direction forming a second included angle with the arrangement direction, and a (2n+1)th wiring region extended from the (2n+1)th driving electrode region toward the (2n+2)th driving electrode region has a wiring extending direction forming a third included angle with the arrangement direction, wherein n is a positive integer. At least one of the first included angle, the second included angle and the third included angle is positive and at least one of the first included angle, the second included angle and the third included angle is negative. An angle of the first included angle is different from an angle of the second included angle.

In an embodiment of the invention, the (2n−1)th wiring region and the (2n)th wiring region are respectively located on two opposite sides of straight connecting lines of the (2n−1)th driving electrode region, the (2n)th driving electrode region, and the (2n+1)th driving electrode region.

In an embodiment of the invention, each of the wiring regions includes a plurality of segments, and two adjacent segments have different extending directions.

In an embodiment of the invention, each of the wiring regions is first extended from one of the driving electrode regions along a first direction and then extended along a second direction toward the next driving electrode region, and the first direction is intersected with the second direction.

In an embodiment of the invention, angles of the first included angle, the second included angle and the third included angle are respectively 5 degrees to 44 degrees.

In an embodiment of the invention, the driving electrode regions and the wiring regions have an average optical transmittance of less than 10%.

In an embodiment of the invention, the driving electrode regions and the wiring regions enclose a plurality of transmission regions, and two adjacent transmission regions arranged along the arrangement direction have different geometric shapes.

In an embodiment of the invention, an average optical transmittance of the transmission regions is 10% to 99%.

In an embodiment of the invention, the display panel further includes a plurality of pixel units, and the pixel units are respectively disposed in the driving electrode regions.

In an embodiment of the invention, each of the pixel units includes a plurality of light-emitting units and a pixel circuit element.

In an embodiment of the invention, the display panel further includes a display medium, wherein each of the pixel units further includes a plurality of pixel electrodes, wherein the pixel electrodes are electrically connected to the pixel circuit elements, and the display medium is adapted to be driven by the pixel units.

In an embodiment of the invention, angles of the first included angle, the second included angle and the third included angle are different from each other.

In an embodiment of the invention, two of the first included angle, the second included angle and the third included angle have the same angle.

In an embodiment of the invention, the first included angle and the second included angle have the same sign, and a sign of the third included angle is opposite to the first included angle.

In an embodiment of the invention, the arrangement direction comprises an x-direction or a y-direction intersecting the x-direction, the plurality of driving electrode regions arranged along the x-direction and the y-direction to form a periodic array, and each of the plurality of wiring regions between the plurality of driving electrode regions has a wiring extending direction forming an included angle with the arrangement direction. A portion of the plurality of wiring regions constitutes a plurality of gate line regions and the other portion of the plurality of wiring regions constitutes a plurality of data line regions. The plurality of gate line regions are arranged in the y-direction and extends along the x-direction as its main extending direction. The plurality of data line regions are arranged in the x-direction and extends along the y-direction as its main extending direction.

In an embodiment of the invention, adjacent gate line regions are symmetrical about an axis.

In an embodiment of the invention, at least one of the plurality of gate line regions are shifted a driving electrode region pitch relative to its adjacent gate line region. The driving electrode region pitch is defined as a distance between centers of two adjacent driving electrode regions.

In an embodiment of the invention, signs of the included angles with the x-direction of the wiring extending directions of the wiring regions contained in the same gate line region or the same data line region are repeated periodically in positive and negative configuration, in positive, positive and negative configuration, in negative, negative and positive configuration or in positive, positive, negative and negative configuration. Signs of the included angles with the y-direction of the wiring extending directions of the wiring regions contained in the same data line region are repeated periodically in positive and negative configuration, in positive, positive and negative configuration, in negative, negative and positive configuration or in positive, positive, negative and negative configuration.

In an embodiment of the invention, the wiring extending direction of the wiring regions contained in the same gate line region or the same data line region are periodically repeated.

In an embodiment of the invention, the arrangement direction is defined as an extension direction of the shortest connection line between two adjacent driving electrode regions.

Based on the above, in the display panel of the invention, the included angles of the wiring extending directions of the wiring regions between adjacent driving electrode regions and the arrangement directions thereof are arranged in a positive and negative alternate configuration in the arrangement directions to effectively reduce the diffraction intensity of first-order diffraction and high-frequency terms, thereby improving the image quality of the display panel.

DESCRIPTION OF THE EMBODIMENTS

Figure 1A:
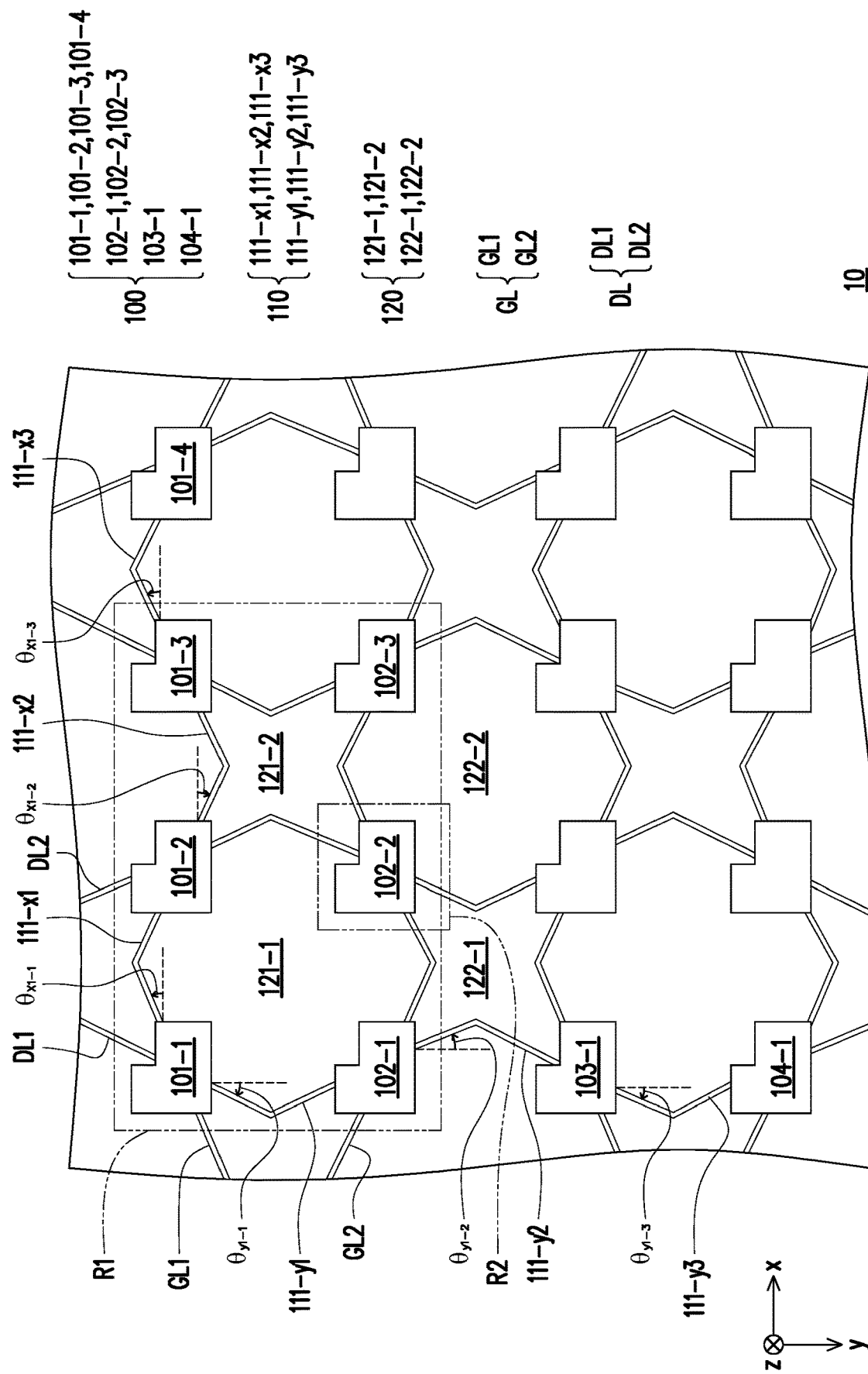
FIG. 1A is a schematic top view of a display panel according to an embodiment of the invention.

The invention is more fully described with reference to the drawings of the present embodiments. However, the invention may also be embodied in various forms and should not be limited to the embodiments described herein. The same or similar reference numerals denote the same or similar elements, and are not repeated in the following paragraphs.

As used herein, "about", "approximately", or "substantially" includes the stated value and the average value within an acceptable deviation of the particular value as determined by one of ordinary skill in the art, taking into account the measurement in question and the specific amount of measurement-related error (i.e., the limitations of the measurement system). For example, "about" may mean within one or a plurality of standard deviations of the stated value, or within ±30%, ±20%, ±10%, ±5%. Furthermore, as used herein, "about", "approximately", or "substantially" may encompass an acceptable range of deviation or standard deviation depending on optical properties, etching properties, or other properties.

Unless otherwise defined, all terms (including technical and scientific terms) used herein have the same meaning as commonly understood by one of ordinary skill in the art to which this invention belongs. Terms such as those defined in commonly used dictionaries should be interpreted as having meanings consistent with their meanings in the context of the related art and the invention, and are not to be interpreted as idealized or overly formal meanings, unless explicitly so defined herein.

Figure 1B:
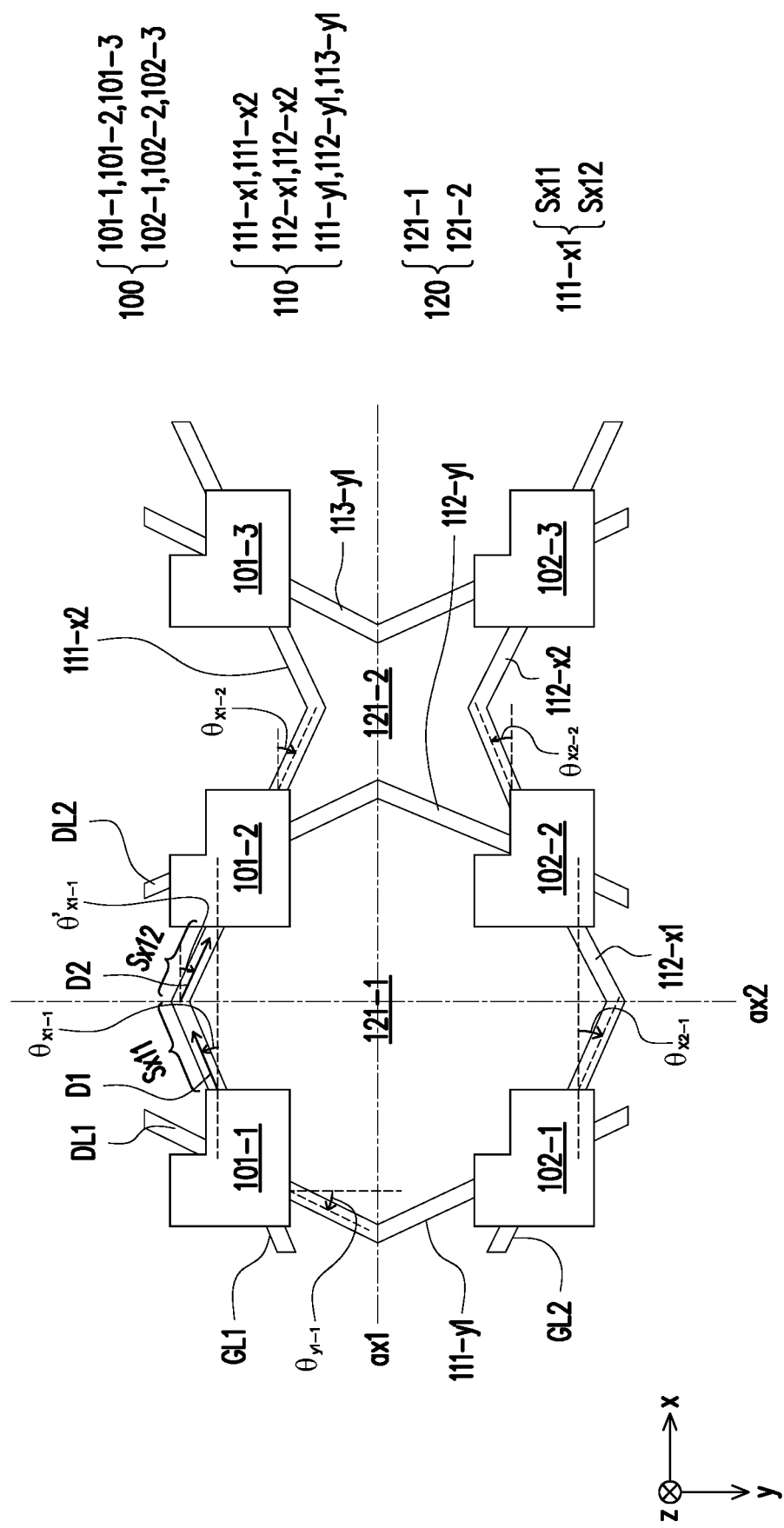
FIG. 1B is a partial enlarged schematic top view of the display panel of FIG. 1A.
Figure 1C:
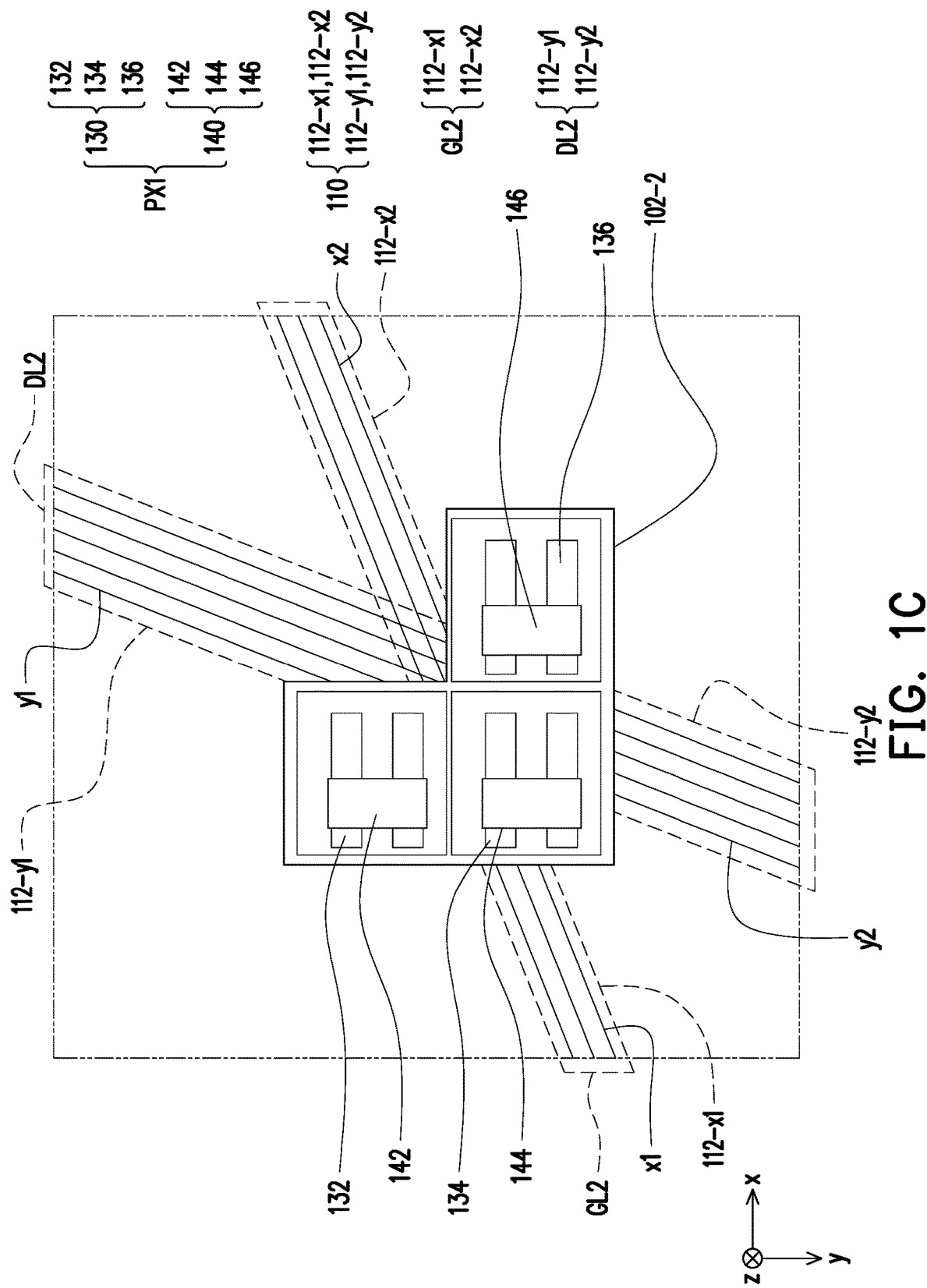
FIG. 1C is a partial enlarged schematic top view of the display panel of FIG. 1A.

FIG. 1A is a schematic top view of a display panel according to an embodiment of the invention. FIG. 1B is a partial enlarged schematic top view of a region R1 of the display panel of FIG. 1A. FIG. 1C is a partial enlarged schematic top view of a region R2 of the display panel of FIG. 1A.

Referring to FIG. 1A to FIG. 1C, a display panel 10 includes a plurality of driving electrode regions 100 and a plurality of wiring regions 110. The plurality of driving electrode regions 100 may be sequentially arranged along the arrangement direction to form a periodic array, and the arrangement direction may be, for example, the x-direction or the y-direction intersecting the x-direction. In some embodiments, the arrangement direction may be defined as an extension direction of the shortest connection line between two adjacent driving electrode regions. The shortest connection line between two adjacent driving electrode regions may refer to a connection line between centers of the two adjacent driving electrode regions. In some embodiments, the x-direction may be perpendicular to the y-direction, but is not limited thereto. The plurality of wiring regions 110 are connected between the driving electrode regions 100. The plurality of wiring regions 110 may be divided into a plurality of gate line regions GL and a plurality of data line regions DL, wherein the main extending directions of the gate line regions GL and the data line regions DL are different. One or a plurality of wirings may be disposed in each of the plurality of wiring regions 110, and the wiring material is, for example, metal, but the invention is not limited thereto. In other words, the wiring regions 110 may be understood as the regions where the wiring is located, and the distribution of the wiring regions 110 may be determined from the outline of the wiring. The wiring in the wiring regions 110 may be used to transmit signals to the corresponding driving electrode regions 100.

In FIG. 1A, from the perspective of the driving electrode regions 100 arranged along a single arrangement direction (x-direction or y-direction), the (2n−1)th wiring region 110 extended from the (2n−1)th driving electrode region 100 toward the (2n)th driving electrode region 100 has a wiring extending direction forming a positive included angle with the arrangement direction, and the (2n)th wiring region 110 extended from the (2n)th driving electrode region 110 toward the (2n+1)th driving electrode region 100 has a wiring extending direction forming a negative included angle with the arrangement direction, wherein n is a positive integer. The (2n−1)th wiring region 110 and the (2n)th wiring region 110 are respectively located on two opposite sides of the straight connecting lines of the (2n−1)th driving electrode region 100, the (2n)th driving electrode region 100, and the (2n+1)th driving electrode region 100.

For example, the plurality of driving electrode regions 100 include driving electrode regions 101-1, 101-2, 101-3, and 101-4 sequentially arranged in the same column along the x-direction, and the plurality of wiring regions 110 may include wiring regions 111-$x$1, 111-$x$2, and 111-$x$3 alternately arranged with the driving electrode regions 101-1, 101-2, 101-3, and 101-4 along the x-direction. That is to say, the wiring region 111-$x$1 is located between the driving electrode regions 101-1 and 101-2, the wiring region 111-$x$2 is located between the driving electrode regions 101-2 and 101-3, and the wiring region 111-$x$3 is located between the driving electrode regions 101-3 and 101-4. In other words, the wiring region 111-$x$1 and the wiring region 111-$x$2 are located on two opposite sides of the straight connecting lines of the driving electrode regions 101-1, 101-2, and 101-3, respectively, and the wiring region 111-$x$2 and the wiring region 111-$x$3 are located on two opposite sides of the straight connecting lines of the driving electrode regions 101-2, 101-3, and 101-4, respectively. The wirings in the wiring regions 111-$x$1, 111-$x$2, and 111-$x$3 are connected to each other to serve as, for example, gate lines. Therefore, the wiring regions 111-$x$1, 111-$x$2, and 111-$x$3 may be regarded as gate line region GL1, and related circuit elements such as driving electrodes in the driving electrode regions 101-1, 101-2, 101-3, and 101-4 may be connected to the wiring in the gate line region GL1 to receive gate signals. In other words, the driving electrode regions 100 arranged in the same column along the x-direction may be connected to the same gate line region GL, and the gate line regions GL may be formed by a plurality of connected wiring regions 110 arranged along the x-direction.

The wiring region 111-$x$1 extended from the driving electrode region 101-1 toward the driving electrode region 101-2 has a wiring extending direction forming a positive included angle $\theta_{x1-1}$ with the x-direction, the wiring region 111-$x$2 extended from the driving electrode region 101-2 toward the driving electrode region 101-3 has a wiring extending direction forming a negative included angle $\theta_{x1-2}$ with the x-direction, and the wiring region 111-$x$3 extended from the driving electrode region 101-3 toward the driving electrode region 101-4 has a wiring extending direction forming a positive included angle $\theta_{x1-3}$ with the x-direction. In the present specification, "wiring extending direction" refers to the wiring region between two driving electrode regions, the wiring extending direction thereof from the initial driving electrode region to the next driving electrode region in the arrangement direction before the first bending. Moreover, in the present specification, the included angle $\theta_x$ of the wiring extending direction and the x-direction is defined as the included angle $\theta_x$ in the counterclockwise direction of the straight connecting lines of adjacent driving electrode regions arranged along the x-direction is a positive included angle, and the included angle $\theta_x$ in the clockwise direction of the straight connecting lines of adjacent driving electrode regions arranged along the x-direction is a negative included angle. In other words, the positive or negative of the included angle $\theta_x$ represents the position thereof relative to the x-direction (straight connecting lines of adjacent driving electrode regions), and the angle of the included angle $\theta_x$ (that is, the absolute value of the included angle $\theta_x$) represents the degree of deviation from the x-direction. Therefore, the included angles $\theta_{x1-1}$, $\theta_{x1-2}$, and $\theta_{x1-3}$ of the wiring regions 111-$x$1, 111-$x$2, and 111-$x$3 with the x-direction between the adjacent driving electrode regions 101-1, 101-2, 101-3, and 101-4 are in an alternating positive and negative configuration. That is, the wiring extending direction of the wiring regions 110 (such as 111-$x$1, 111-$x$2, and 111-$x$3) contained in the same gate line region GL (such as GL1) are periodically repeated every two wiring regions as a cycle.

In some embodiments, the angles of the included angles $\theta_{x1-1}$, $\theta_{x1-2}$, and $\theta_{x1-3}$ may respectively be 5 degrees to 44 degrees, so that the size of the light-transmitting opening formed by the wiring regions is variable, without causing a significant increase in the resistance-capacitance load of the wiring regions 110, while still maintaining good electrical performance. In some embodiments, the angles (angle magnitudes) of the included angles $\theta_{x1-1}$, $\theta_{x1-2}$, and $\theta_{x1-3}$ are substantially the same, that is, the wiring extending directions of the adjacent wiring regions 111-$x$1 and 111-$x$2 are different, but the wiring region 111-$x$1 and the wiring region 111-$x$3 separated by one wiring region have the same trend of wiring extending directions. However, the invention is not limited thereto, and in other embodiments, the angles of the included angles $\theta_{x1-1}$, $\theta_{x1-2}$, and $\theta_{x1-3}$ may be different.

Moreover, the plurality of driving electrode regions 100 include driving electrode regions 101-1, 102-1, 103-1, 104-1 sequentially arranged in the same row along the y-direction, and the plurality of wiring regions 110 include wiring regions 111-$y$1, 111-$y$2, and 111-$y$3 alternately arranged with the driving electrode regions 101-1, 102-1, 103-1, and 104-1 along the y-direction. In other words, the wiring region 111-y1 is located between the driving electrode regions 101-1 and 102-1, the wiring region 111-y2 is located between the driving electrode regions 102-1 and 103-1, and the wiring region 111-y3 is located between the driving electrode regions 103-1 and 104-1. In other words, the wiring region 111-y1 and the wiring region 111-y2 are respectively located on two opposite sides of the straight connecting lines of the driving electrode regions 101-1, 102-1 and 103-1, and the wiring region 111-y2 and the wiring region 111-y3 are respectively located on two opposite sides of the straight connecting lines of the driving electrode regions 102-1, 103-1 and 104-1. The wirings in the wiring regions 111-y1, 111-y2, and 111-y3 are connected to each other to serve as, for example, data lines, and therefore the wiring regions 111-y1, 111-y2, and 111-y3 may be regarded as data line regions DL1, and related circuit elements such as driving electrodes in the driving electrode regions 101-1, 102-1, 103-1, and 104-1 may be connected to the wirings in the data line regions DL1 to receive data signals. In other words, the driving electrode regions 100 arranged in the same row along the y-direction may be connected to the same data line region DL, and the data line regions DL may be formed by the plurality of connected wiring regions 110 arranged along the y-direction.

The wiring region 111-y1 extended from the driving electrode region 101-1 toward the driving electrode region 102-1 has a wiring extending direction forming a negative included angle $\theta_{y1-1}$ with the y-direction, the wiring region 111-y2 extended from the driving electrode region 102-1 toward the driving electrode region 103-1 has a wiring extending direction forming a positive included angle $\theta_{y1-2}$ with the y-direction, and the wiring region 111-y3 extended from the driving electrode region 103-1 toward the driving electrode region 104-1 has a wiring extending direction forming a negative included angle $\theta_{y1-3}$ with the y-direction. In the present specification, the included angle $\theta_y$ between the wiring extending direction and the y-direction is defined as the included angle $\theta_y$ in the counterclockwise direction of the straight connecting lines of adjacent driving electrode regions arranged along the y-direction is a positive included angle, and the included angle $\theta_y$ in the clockwise direction of the straight connecting lines of adjacent driving electrode regions arranged along the y-direction is a negative included angle. That is to say, the positive or negative of the included angle $\theta_y$ represents the position thereof relative to the y-direction (straight connecting lines of adjacent driving electrode regions), and the angle of the included angle $\theta_y$ (that is, the absolute value of the included angle $\theta_y$) represents the degree of deviation from the y-direction. Therefore, the included angles $\theta_{y1-1}$, $\theta_{y1-2}$, and $\theta_{y1-3}$ of the wiring regions 111-y1, 111-y2, and 111-y3 and the y-direction between the adjacent driving electrode regions 101-1, 102-1, 103-1, and 104-1 are in an alternating positive and negative configuration. That is, the wiring extending direction of the wiring regions 110 (such as 111-y1, 111-y2, and 111-y3) contained in the same data line region DL (such as DL1) are periodically repeated every two wiring regions as a cycle.

In some embodiments, the angles of the included angles $\theta_{y1-1}$, $\theta_{y1-2}$, and $\theta_{y1-3}$ may respectively be 5 degrees to 44 degrees, so that the size of the light-transmitting opening formed by the wiring regions is variable without causing a significant increase in the resistance-capacitance load of the wiring regions 110, while still maintaining good electrical performance.

In some embodiments, the angles (angle sizes) of the included angles $\theta_{y1-1}$, $\theta_{y1-2}$, and $\theta_{y1-3}$ are substantially the same, that is to say, the wiring extending directions of adjacent wiring regions 111-y1 and 111-y2 are different, but the wiring region 111-y1 and the wiring region 111-y3 separated by one wiring region have the same trend of wiring extending directions. However, the invention is not limited thereto, and in other embodiments, the angles of the included angles $\theta_{y1-1}$, $\theta_{y1-2}$, and $\theta_{y1-3}$ may be different.

In an embodiment, the angle of the included angle $\theta_x$ of the wiring extending direction of the wiring regions 110 arranged along the x-direction and the x-direction may be the same as the angle of the included angle $\theta_y$ of the wiring extending direction of the wiring regions 110 arranged along the y-direction and the y-direction. For example, the angle of the included angle $\theta_{x1-1}$ between the wiring extending direction of the wiring region 111-x1 extended from the driving electrode region 101-1 toward the driving electrode region 101-2 and the x-direction and the angle of the included angle $\theta_{y1-1}$ between the wiring region 111-y1 extended from the driving electrode region 101-1 toward the driving electrode region 102-1 and the y-direction are substantially the same.

In an embodiment, two adjacent gate line regions GL are symmetrical about each other, and two adjacent data line regions DL are symmetrical about each other, but not limited thereto. For example, as shown in FIG. 1B, the gate line region GL1 and the gate line region GL2 are symmetrical about an axis ax1, wherein the gate line region GL1 includes the wiring region 111-x1 and the wiring region 111-x2, and the gate line region GL2 includes a wiring region 112-x1 and a wiring region 112-x2. The wiring region 111-x1 corresponds to the wiring region 112-x1 and the wiring region 111-x2 corresponds to the wiring region 112-x2. That is to say, the wiring region 111-x1 and the wiring region 112-x1 are symmetrical about the axis ax1, and the wiring region 111-x2 and the wiring region 112-x2 are symmetrical about the axis ax1. Therefore, the included angle $\theta_{x1-1}$ is substantially equal to the negative included angle $\theta_{x2-1}$ and the included angle $\theta_{x1-2}$ is substantially equal to the negative included angle $\theta_{x2-2}$. In other words, the product of the included angles with the x-direction of the wiring extending directions of the two adjacent and corresponding wiring regions located at the adjacent gate line regions GL respectively is a negative value. Similarly, the data line region DL1 and a data line region DL2 are symmetrical about an axis ax2, wherein the data line region DL1 includes the wiring region 111-y1, and the data line region DL2 includes a wiring region 112-y1. The wiring region 111-y1 corresponds to the wiring region 112-y1. That is to say, the wiring region 111-y1 and the wiring region 112-y1 are symmetrical about the axis ax2. Therefore, the included angle $\theta_{y1-1}$ is substantially equal to the negative included angle of the wiring extending direction of the corresponding wiring region 112-y1 located at the adjacent data line region DL2. In other words, the product of the included angles with the y-direction of the wiring extending directions of the two adjacent and corresponding wiring regions located at the adjacent data line regions DL respectively is a negative value.

In other embodiments, two adjacent gate line regions GL may not be symmetrical about each other, and thus the included angles with the x-direction of the wiring extending directions of the two adjacent and corresponding wiring regions located at the adjacent gate line regions GL respectively may be different from each other. In other embodiments, two adjacent data line regions DL may not be symmetrical about each other, and thus the included angles with the y-direction of the wiring extending directions of the two adjacent and corresponding wiring regions located at the adjacent data line regions DL respectively may be different from each other.

In some embodiments, each of the wiring regions 110 may include a plurality of segments, and two adjacent segments have different extending directions. For example, as shown in FIG. 1B, the wiring region 111-x1 includes a first segment Sx11 and a second segment Sx12 arranged in sequence in the x-direction, and the first segment Sx11 and the second segment Sx12 are symmetrical about each other, for example, symmetrical about the axis ax2, but not limited thereto. The first segment Sx11 is extended from the driving electrode region 101-1 along a first direction D1, the second segment Sx12 is extended from the end of the first segment Sx11 toward the driving electrode region 101-2 along a second direction D2, the first direction D1 and the second direction D2 are intersected with each other, and the second direction D2 is a direction more toward the driving electrode region 101-2 than the first direction D1. The first direction D1 is, for example, a direction forming the positive included angle $\theta_{x1-1}$ with the x-direction, the second direction D2 is, for example, a direction forming a negative included angle $\theta'_{x1-1}$ with the x-direction, and the angle of the included angle $\theta_{x1-1}$ and the angle of the included angle $\theta'_{x1-1}$ may be the same. In other words, the wiring region 111-x1 is connected from the driving electrode region 101-1 to the driving electrode region 101-2 after being bent once. Since the wiring regions 110 of two adjacent driving electrode regions 100 do not directly connect the adjacent driving electrode regions 100 in a straight line, the size of the light-transmitting openings formed by the wiring regions may be varied, thus facilitating to disperse the diffraction of high-frequency terms, thereby effectively reducing the diffraction intensity of high-frequency terms, and thereby improving the image quality of the display panel 10.

In some embodiments, the driving electrode regions 100 and the wiring regions 110 may enclose a plurality of transmission regions 120. The average optical transmittance of the transmission regions 120 is 10% to 99%, and the driving electrode regions 100 and the wiring regions 110 have an average optical transmittance of less than 10%. That is to say, the driving electrode regions 100 and the wiring regions 110 are non-transmission regions compared to the transmission regions 120. In some embodiments, a light-shielding layer (not shown) may be used to cover the edge of the wiring regions 110 and/or the driving electrode regions 100, so that the average optical transmittance of the driving electrode regions 100 and the wiring regions 110 is less than 10%. In some embodiments, the light-shielding layer may be made of a light-shielding material such as light-shielding resin and metal.

In some embodiments, two adjacent transmission regions 120 arranged along the arrangement direction have different geometric shapes. For example, as shown in FIG. 1A and FIG. 1B, a transmission region 121-1 enclosed by the driving electrode regions 101-1, 101-2, 102-1, and 102-2 and the wiring regions 111-x1, 112-x1, 111-y1, and 112-y1 has a shape similar to a convex octagon, and a transmission region 121-2 enclosed by the driving electrode regions 101-2, 101-3, 102-2, and 102-3 and the wiring regions 111-x2, 112-x2, 112-y1, and 113-y1 has a shape similar to a star. In FIG. 1A, the transmission regions 120 having a shape similar to a convex octagon and the transmission regions 120 having a shape similar to a star are staggered in the arrangement direction. In other words, two adjacent transmission regions 120 arranged along the arrangement direction have different geometric shapes, and every other transmission region 120 in the arrangement direction may have the same geometric shape. In some embodiments, two adjacent transmission regions 120 arranged along the arrangement direction have different areas. For example, the area of the transmission region 121-1 is greater than the area of the transmission region 121-2.

In some embodiments, the shapes of the transmission regions 120 arranged in adjacent rows/columns along the arrangement direction are staggered with each other. For examples, a shape of a transmission region 122-1 next to the transmission region 121-1 along the y direction is different from the shape of the transmission region 121-1 and is substantially the same as the shape of the transmission region 121-2, and a shape of a transmission region 122-2 arranged sequentially with the transmission region 122-1 along the x-direction and next to the transmission regions 121-2 is different from the shape of the transmission region 121-2 and is substantially the same as the shape of the transmission region 121-1. In other words, the transmission regions 120 enclosed by any 2×3(row×column) array or 3×2 (row×column) array of driving electrode regions with its corresponding wiring regions have different shapes. For convenience of illustration, only the layout of each of the wiring regions is shown schematically in FIG. 1A and FIG. 1B. However, it should be understood that a plurality of wirings may be disposed in each of the wiring regions 110, as shown in FIG. 1C. In addition, a plurality of wirings in each of the wiring regions may be arranged side by side on the same film layer or located on different film layers and possibly overlapped with each other. Each of the wiring regions 110 may be centrally arranged with a plurality of wirings to help reduce the intensity of the first-order diffraction caused by the wiring layout and improve the average optical transmittance of the transmission regions 120.

In some embodiments, a plurality of wirings may be disposed in the same gate line region GL and extended across the driving electrode region 100 corresponding to the same gate line region GL to be overlapped with the driving electrode region 100. In addition, the wirings in the corresponding segments of two wiring regions 110 adjacent to two sides of the same driving electrode region 100 may have the same extending direction and be on the same line. For example, as shown in FIG. 1C, in the gate line region GL2, the second segment located in the wiring region 112-x1 and the first segment located in the wiring region 112-x2 are two segments adjacent to the driving electrode region 102-2. The extending direction of a wiring x1 located in the second segment of the wiring region 112-x1 is the same as and on the same line as the extending direction of a wiring x2 located in the first segment of the wiring region 112-x2. In some embodiments, the wirings x1 and x2 may be extended toward the corresponding driving electrode region 102-2 and connected to each other to form a continuous signal line (e.g., a gate line). The elements and signal lines in the driving electrode region 102-2 may be located in different layers according to circuit connection requirements, so as to avoid unnecessary short circuits.

Similarly, a plurality of wirings may be disposed in the same data line region DL and extended across the driving electrode region 100 corresponding to the same data line region DL and overlapped with the driving electrode region 100. In addition, the corresponding segments of two wiring regions 110 adjacent to two sides of the same data line region DL have the same extending direction and are on the same line. For example, as shown in FIG. 1C, in the data line region DL2, the second segment located in the wiring region 112-y1 and the first segment located in a wiring region 112-y2 are two segments adjacent to the driving electrode region 102-2. The extending direction of a wiring y1 located in the second segment of the wiring region 112-y1 is the same as and on the same line as the extending direction of a wiring y2 located in the first segment of the wiring region 112-$y$2. In some embodiments, the wiring y1 and the wiring y2 may be extended toward the corresponding driving electrode region 102-2 and be connected to each other to form a continuous signal line (e.g., a data line). The elements and data lines in the driving electrode region 102-2 may be located in different layers according to circuit connection requirements, so as to avoid unnecessary short circuits.

In some embodiments, as shown in FIG. 1C, the projection of the driving electrode regions 100 in the z-direction is partially overlapped with the projection of the wiring in the wiring regions 110 in the z-direction, so as to expand the range of the transmission regions 120, but the invention is not limited thereto. In other embodiments, the projection of the driving electrode regions 100 in the z-direction and the projection of the wiring in the wiring regions 110 in the z-direction may be not overlapped.

In FIG. 1C, the shape of the driving electrode regions 100 is approximately the shape of L. It should be understood that the shape of the driving electrode regions 100 is not limited thereto. Other geometric shapes of the driving electrode regions 100 may be used according to different display panels, such as rectangles, circles, trapezoids, or other arbitrary geometric shapes.

Referring to FIG. 1C, the display panel 10 may be a micro-LED display panel further including a plurality of pixel units PX1. The pixel units PX1 are respectively disposed in the driving electrode regions 100, and each of the pixel units PX1 may include a pixel circuit element 130 and a plurality of light-emitting units 140. For example, the pixel circuit element 130 includes, for example, a thin-film transistor (TFT) adapted to drive the plurality of light-emitting units 140. The plurality of light-emitting units 140 may include three micro-LEDs 142, 144, and 146 to emit light of different colors. For example, the micro-LEDs 142, 144, and 146 may emit blue, green, and red light, respectively, but the invention is not limited thereto. In some embodiments, the pixel circuit element 130 may include three pixel circuit units 132, 134, and 136 to drive the micro-LEDs 142, 144, and 146 respectively, but the invention is not limited thereto. The micro-LED 142 and the micro-LED 144 may be arranged along the y-direction, the micro-LED 146 is located on one side of the micro-LED 144 and arranged along the x-direction with the micro-LED 144, but may also be arranged in different ways depending on different designs. In other embodiments, the micro-LEDs 142, 144, and 146 may all be arranged along the x-direction or the y-direction, so that the shape of the driving electrode regions 100 is rectangular. The micro-LEDs 142, 144, and 146 have self-luminous properties and do not need an additional light source, and may receive electrical signals and power needed for luminescence via the corresponding wiring in the data line region DL2.

Figure 2A:
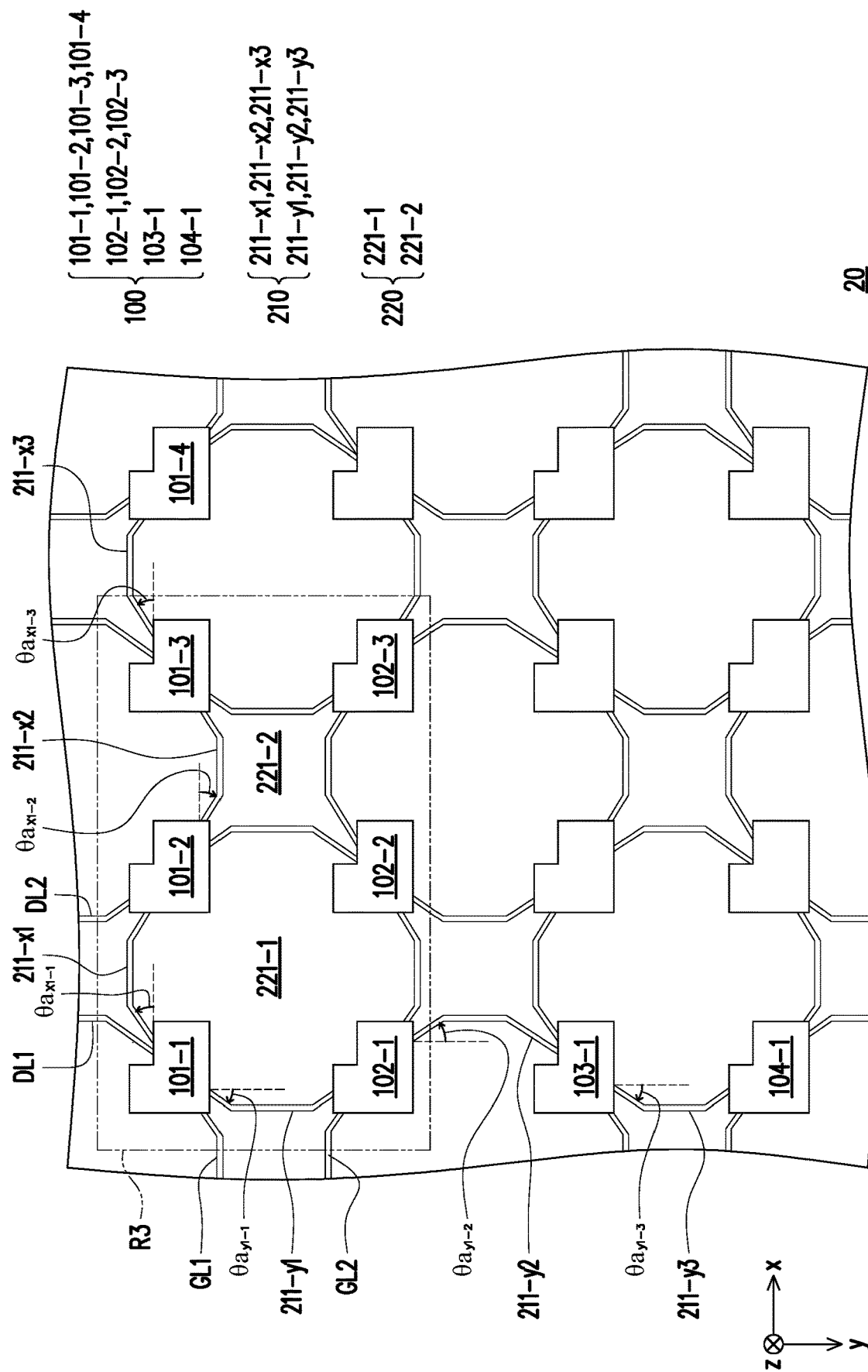
FIG. 2A is a schematic top view of a display panel according to an embodiment of the invention.
Figure 2B:
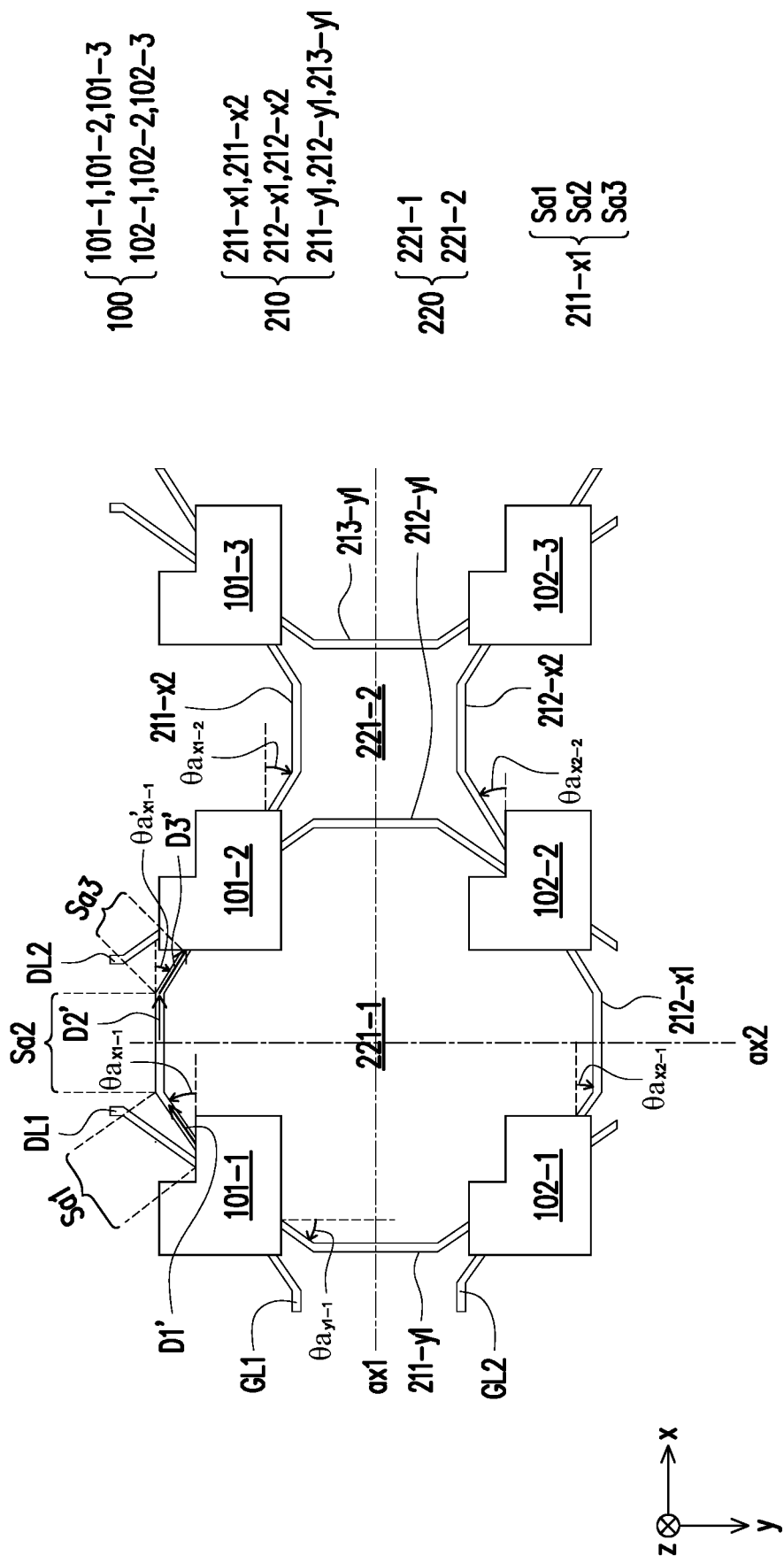
FIG. 2B is a partial enlarged schematic top view of the display panel of FIG. 2A.

FIG. 2A is a schematic top view of a display panel according to an embodiment of the invention. FIG. 2B is a partially enlarged top plan view of a region R3 of the display panel of FIG. 2A. It should be mentioned here that the embodiment of FIG. 2A and FIG. 2B adopts the reference numerals and a portion of the content of the embodiment of FIG. 1A and FIG. 1B, wherein the same or similar reference numerals are used to represent the same or similar elements, and the description of the same technical content is omitted. For the description of the omitted portion, reference may be made to the above embodiment, which is not repeated herein.

Referring to FIG. 2A and FIG. 2B, a display panel 20 includes the plurality of driving electrode regions 100 and a plurality of wiring regions 210, and the plurality of wiring regions 210 are connected between the driving electrode regions 100. The driving electrode regions 100 may be sequentially arranged along the arrangement direction to form a periodic array, and the arrangement direction may be, for example, the x-direction or the y-direction perpendicular to the x-direction. The (2n−1)th wiring region 210 extended from the (2n−1)th driving electrode region 100 toward the (2n)th driving electrode region 100 has a wiring extending direction forming a positive included angle with the arrangement direction, and the (2n)th wiring region 210 extended from the (2n)th driving electrode region 100 toward the (2n+1)th driving electrode region 100 has a wiring extending direction forming a negative included angle with the arrangement direction, wherein n is a positive integer. For example, included angles $\theta a_{x1\text{-}1}$, $\theta a_{x1\text{-}2}$, and $\theta a_{x1\text{-}3}$ of wiring regions 211-$x$1, 211-$x$2, and 211-$x$3 with the x-direction between the adjacent driving electrode regions 101-1, 101-2, 101-3, and 101-4 are in an alternating positive and negative configuration. Included angles $\theta a_{y1\text{-}1}$, $\theta a_{y1\text{-}2}$, and $\theta a_{y1\text{-}3}$ of wiring regions 211-$y$1, 211-$y$2, and 211-$y$3 and the y-direction between the adjacent driving electrode regions 101-1, 102-1, 103-1, and 104-1 are in an alternating positive and negative configuration.

Different from the display panel 10, in the present embodiment, as shown in FIG. 2B, each of the wiring regions 210 includes three segments with different extending directions. For example, the wiring region 211-$x$1 includes a first segment Sa1, a second segment Sa2, and a third segment Sa3 arranged in sequence in the x-direction. The first segment Sa1 is extended from the driving electrode region 101-1 along a first direction D1', the second segment Sa2 is extended from the end of the first segment Sa1 along a second direction D2', and the third segment Sa3 is extended from the end of the second segment Sa2 along a third direction D3' toward the driving electrode region 101-2. The first direction D1', the second direction D2', and the third direction D3' are different directions and intersected with each other. Compared with the first direction D1', the second direction D2' is a direction more toward the driving electrode region 101-2, and the third direction D3' is a direction more toward the driving electrode region 101-2 compared with the second direction D2'. For example, the first direction D1' is a direction forming the positive included angle $\theta a_{x1\text{-}1}$ with the x-direction, the second direction D2' is a direction parallel to the x-direction, and the third direction D3' is a direction forming a negative included angle $\theta a'_{x1\text{-}1}$ with the x-direction, wherein the angle of the included angle $\theta a_{x1\text{-}1}$ and the angle of the included angle $\theta a'_{x1\text{-}1}$ may be the same. In other words, the wiring region 211-$x$1 is connected from the driving electrode region 101-1 to the driving electrode region 101-2 after being bent twice. Since the wiring regions 210 of the adjacent driving electrode regions 100 do not directly connect the adjacent driving electrode regions 100 in a straight line manner, the size of the light-transmitting opening formed in the wiring regions may be varied, thus helping to disperse the diffraction of high-frequency terms. Thus, the diffraction intensity of high-frequency terms is effectively reduced, and the image quality of the display panel 20 is improved.

In the present embodiment, the driving electrode regions 100 and the wiring regions 210 may enclose a plurality of transmission regions 220, and two adjacent transmission regions 220 arranged along the arrangement direction have different geometric shapes, and the areas of two adjacent transmission regions 220 arranged along the arrangement direction are different. For example, as shown in FIG. 2A and FIG. 2B, a transmission region 221-1 enclosed by the driving electrode regions 101-1, 101-2, 102-1, and 102-2 and the wiring regions 211-x1, 212-x1, 211-y1, and 212-y1 has a convex polygon shape, and a transmission region 221-2 enclosed by the driving electrode regions 101-2, 101-3, 102-2, and 102-3 and the wiring regions 211-x2, 212-x2, 212-y1, and 213-y1 has a concave polygon shape. The transmission regions 220 having the same shape as the transmission region 221-1 and the transmission regions 220 having the same shape as the transmission region 221-2 are staggered in the arrangement direction, and the area of the transmission region 221-1 is greater than the area of the transmission region 221-2.

Figure 3:
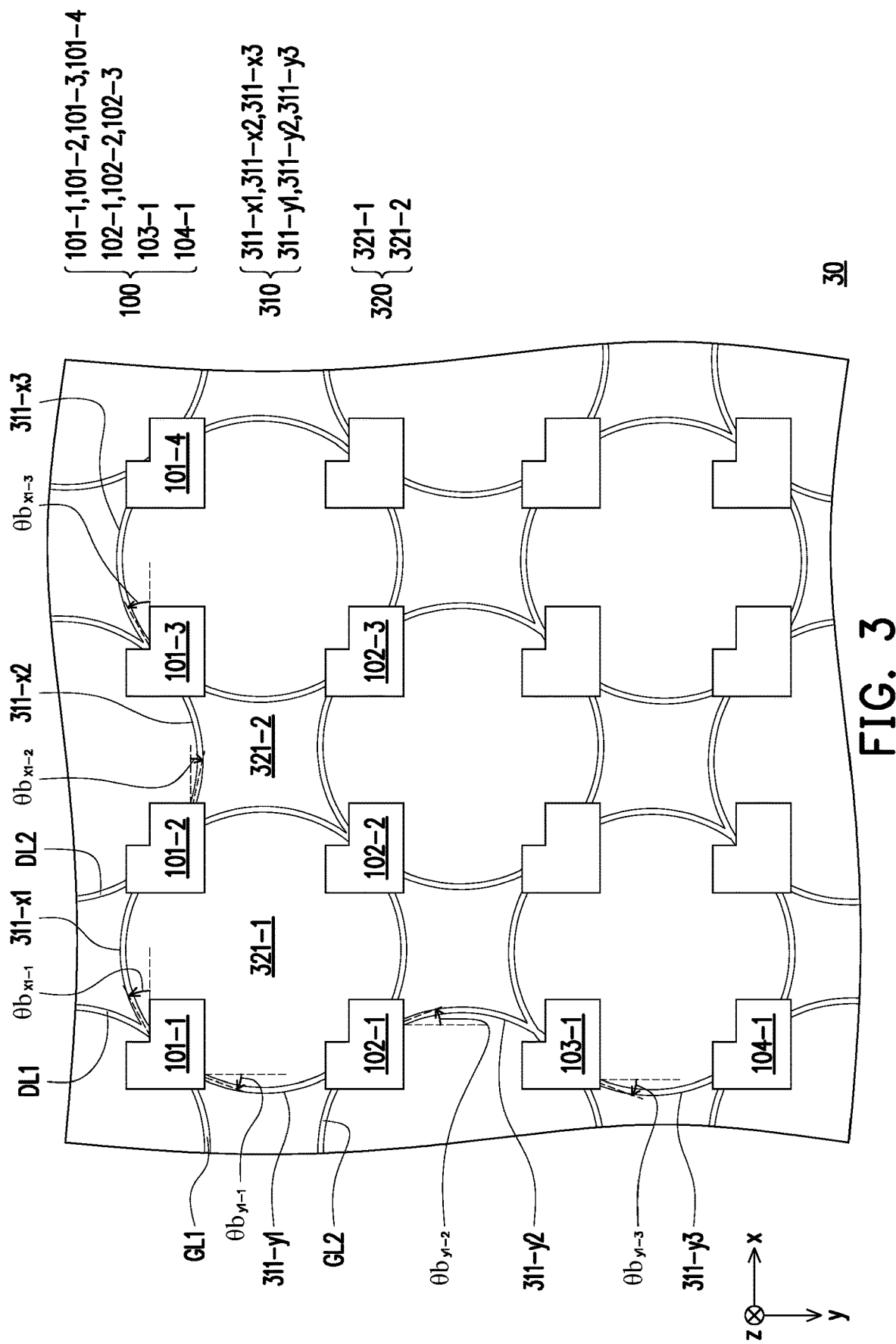
FIG. 3 is a schematic top view of a display panel according to an embodiment of the invention.

FIG. 3 is a schematic top view of a display panel according to an embodiment of the invention. It should be mentioned here that the embodiment of FIG. 3 adopts the reference numerals and a portion of the content of the embodiment of FIG. 1A, wherein the same or similar elements are denoted by the same or similar reference numerals, and the description of the same technical content is omitted. For the description of the omitted portion, reference may be made to the above embodiments, which is not repeated herein.

Referring to FIG. 3, a display panel 30 includes the plurality of driving electrode regions 100 and a plurality of wiring regions 310, and the plurality of wiring regions 310 are connected between the driving electrode regions 100. The driving electrode regions 100 may be sequentially arranged along the arrangement direction to form a periodic array, and the arrangement direction may be, for example, the x-direction or the y-direction perpendicular to the x-direction. The (2n-1)th wiring region 310 extended from the (2n−1)th driving electrode region 100 toward the (2n)th driving electrode region 100 has a wiring extending direction forming a positive included angle with the arrangement direction, and the (2n)th wiring region 310 extended from the (2n)th driving electrode region 100 toward the (2n+1)th driving electrode region 100 has a wiring extending direction forming a negative included angle with the arrangement direction, wherein n is a positive integer. For example, included angles $\theta b_{x1-1}$, $\theta b_{x1-2}$, and $\theta b_{x1-3}$ of wiring regions 311-x1, 311-x2, and 311-x3 with the x-direction between the adjacent driving electrode regions 101-1, 101-2, 101-3, and 101-4 are in an alternating positive and negative configuration. Included angles $\theta b_{y1-1}$, $\theta b_{y1-2}$, and $\theta b_{y1-3}$ of wiring regions 311-y1, 311-y2, and 311-y3 and the y-direction between the adjacent driving electrode regions 101-1, 102-1, 103-1, and 104-1 are in an alternating positive and negative configuration.

Different from the display panel 10, in the present embodiment, each of the wiring regions 310 includes segments (not marked) with an infinite number of different extending directions, that is, the wiring regions 310 are connected from the driving electrode region 101-1 to the driving electrode region 101-2 after being bent an infinite number of times. Since each of the wiring regions 310 includes segments with an infinite number of different extending directions, each of the wiring regions 310 has an arc shape. In some embodiments, the wiring regions 310 between the driving electrode regions 101-1, 102-1, 101-2, and 102-2 may be extended along a circular track. However, in some embodiments, the wirings regions 310 may have different centers of curvature. Since the wiring regions 310 of two adjacent driving electrode regions 100 do not directly connect the adjacent driving electrode regions 100 in a straight line manner, the size of the light-transmitting opening formed in the wiring regions may be varied, thus helping to disperse the diffraction of high-frequency terms. Thus, the diffraction intensity of high-frequency terms is effectively reduced, and the image quality of the display panel 30 is improved.

In the present embodiment, the driving electrode regions 100 and the wiring regions 310 may enclose a plurality of transmission regions 320, and two adjacent transmission regions 320 arranged along the arrangement direction of the driving electrode regions 100 have different geometric shapes and different areas. For example, as shown in FIG. 3, the transmission regions 320 having the same shape as a transmission region 321-1 and the transmission regions 320 having the same shape as a transmission region 321-2 are staggered in the arrangement direction, and the area of the transmission region 321-1 is greater than the area of the transmission region 321-2.

Figure 4A:
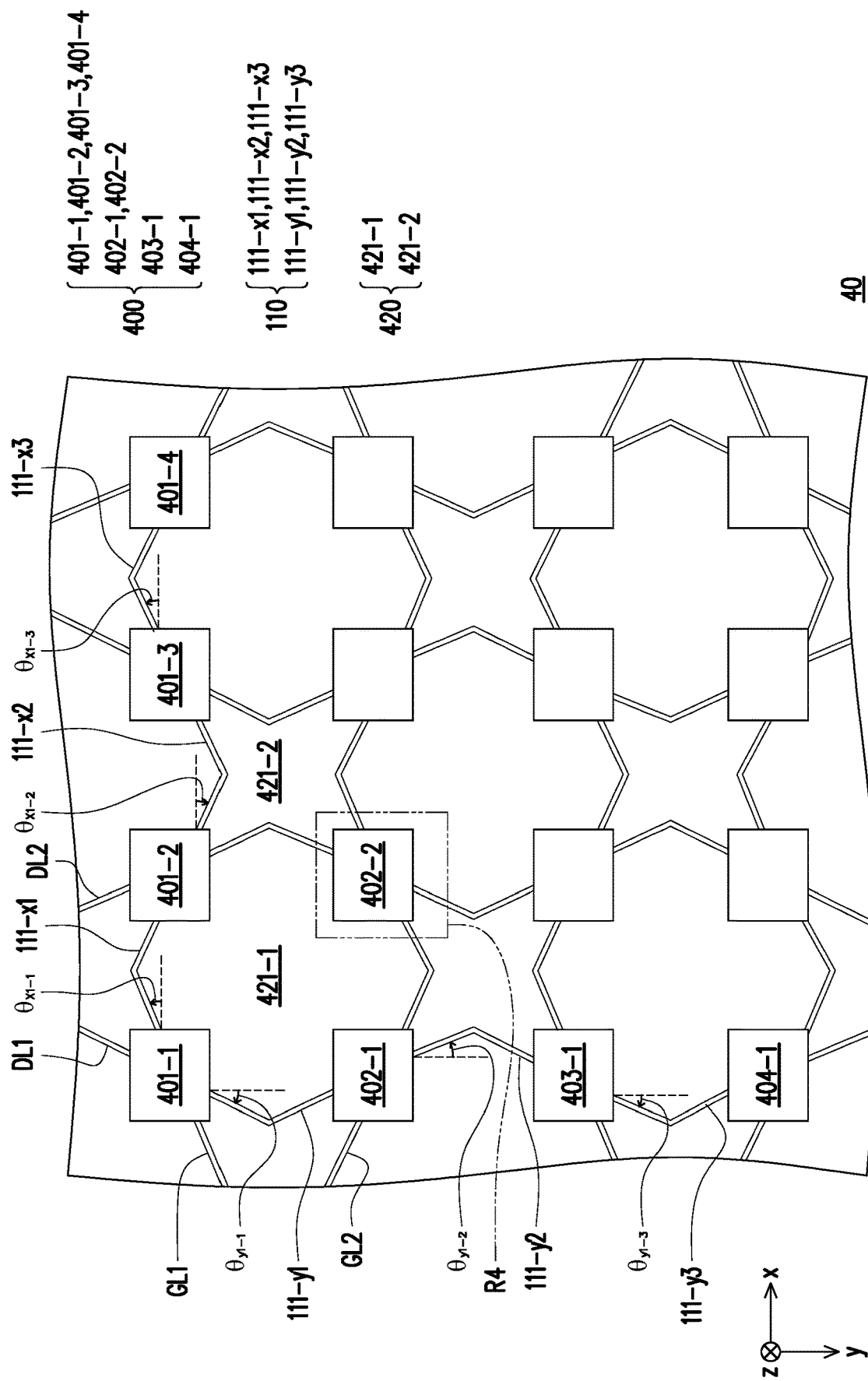
FIG. 4A is a schematic top view of a display panel according to an embodiment of the invention.
Figure 4B:
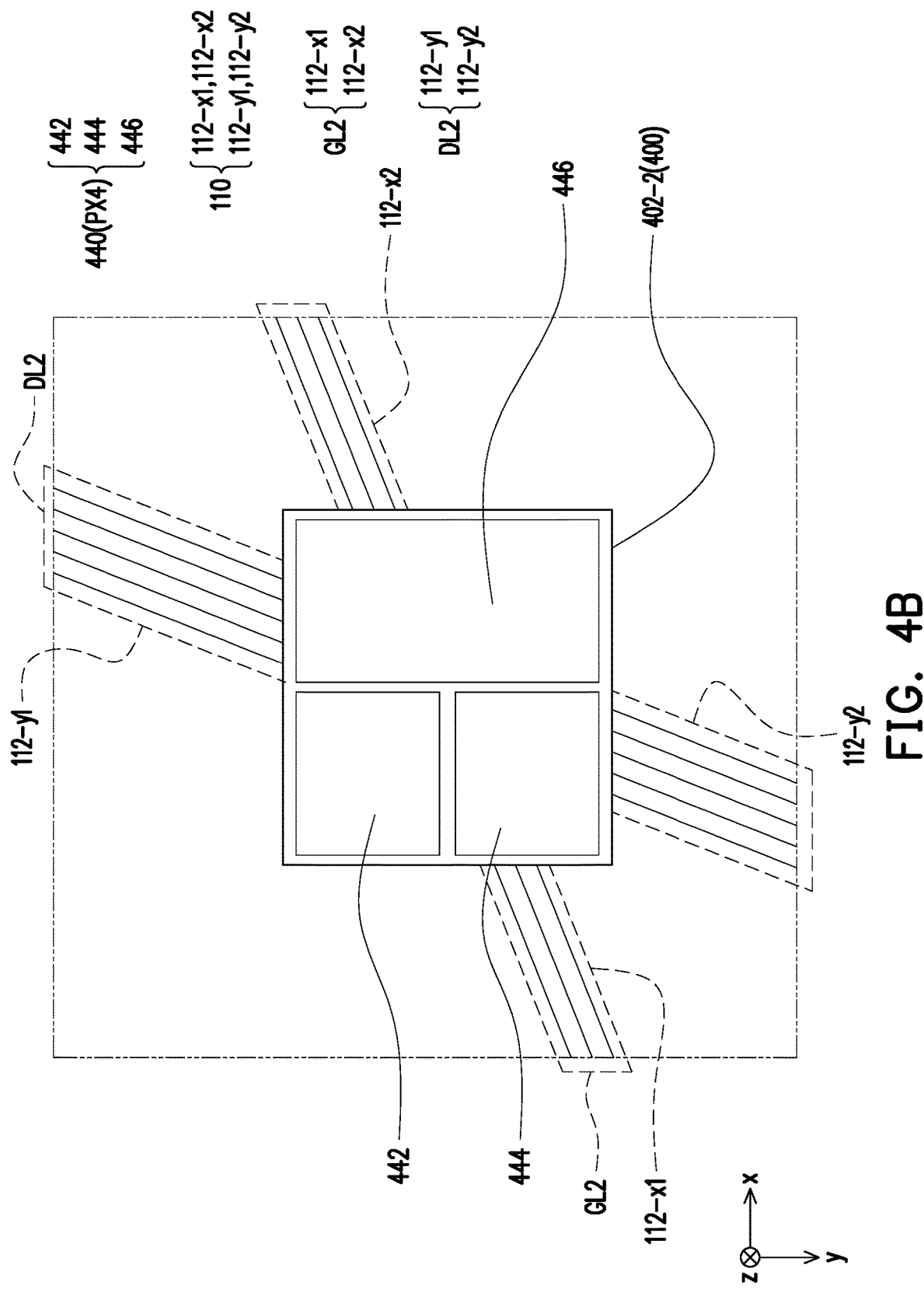
FIG. 4B is a partial enlarged schematic top view of the display panel of FIG. 4A.

FIG. 4A is a schematic top view of a display panel according to an embodiment of the invention. FIG. 4B is a partially enlarged top plan view of a region R4 of the display panel of FIG. 4A. It should be mentioned here that, the embodiment of FIG. 4A and FIG. 4B adopts the reference numerals and a portion of the content of the embodiment of FIG. 1A and FIG. 1C, wherein the same or similar elements are denoted by the same or similar reference numerals, and the description of the same technical content is omitted. For the description of the omitted portion, reference may be made to the above embodiments, which is not repeated herein.

Referring to FIG. 4A and FIG. 4B, a display panel 40 includes a plurality of driving electrode regions 400 and the plurality of wiring regions 110, and the plurality of wiring regions 110 are connected between the driving electrode regions 400. The driving electrode regions 400 may be sequentially arranged along the arrangement direction to form a periodic array, and the arrangement direction may be, for example, the x-direction or the y-direction perpendicular to the x-direction. The (2n−1)th wiring region 110 extended from the (2n−1)th driving electrode region 400 toward the (2n)th driving electrode region 400 has a wiring extending direction forming a positive included angle with the arrangement direction, and the (2n)th wiring region 110 extended from the (2n)th driving electrode region 400 toward the (2n+1)th driving electrode region 400 has a wiring extending direction forming a negative included angle with the arrangement direction, wherein n is a positive integer. For example, the included angles $\theta_{x1-1}$, $\theta_{x1-2}$, and $\theta_{x1-3}$ of the wiring regions 111-x1, 111-x2, and 111-x3 with the x-direction between adjacent driving electrode regions 401-1, 401-2, 401-3, and 401-4 are in an alternating positive and negative configuration. The included angles $\theta_{y1-1}$, $\theta_{y1-2}$, and $\theta_{y1-3}$ of the wiring regions 111-y1, 111-y2, and 111-y3 and the y-direction between adjacent driving electrode regions 401-1, 402-1, 403-1, and 404-1 are in an alternating positive and negative configuration.

Different from the display panel 10, in the present embodiment, the display panel 40 may be an OLED display panel, and the shape of the driving electrode regions 400 is a rectangle. The display panel 40 includes a plurality of pixel units PX4. The pixel units PX4 are respectively disposed in the driving electrode regions 400, and each of the pixel units PX4 may include a pixel circuit element (not shown) and a plurality of light-emitting units 440. For example, the pixel circuit elements include, for example, TFTs adapted to drive the plurality of light-emitting units 440. The plurality of light-emitting units 440 may include three OLEDs 442, 444, and 446 to emit light of different colors. For example, the OLEDs 442, 444, and 446 may emit red, green, and blue light, respectively, but the invention is not limited thereto. The light-emitting areas of the OLEDs 442, 444, and 446 may be adjusted according to the desired light-emitting effect. For example, the OLED 446 may have a greater light-emitting area than the OLED 442 and the OLED 444, but is not limited thereto. In the present embodiment, the OLEs 442 and the OLED 444 are arranged along the y-direction and located on the same side of the OLED 446. However, the arrangement and quantity of the OLEDs 442, 444, and 446 are not limited to the present embodiment. The OLEDs 442, 444, and 446 have self-luminous properties and do not need an additional light source, and may receive electrical signals and power needed for light emission via the corresponding wiring in the data line region DL2.

In the present embodiment, the driving electrode regions 400 and the wiring regions 410 may enclose a plurality of transmission regions 420, and two adjacent transmission regions 420 arranged along the arrangement direction of the driving electrode regions 400 have different geometric shapes and different areas. For example, as shown in FIG. 4A, the transmission regions 420 having the same shape as a transmission region 421-1 and the transmission regions 420 having the same shape as a transmission region 421-2 are staggered in the arrangement direction, and the area of the transmission region 421-1 is greater than the area of the transmission region 421-2.

Figure 5A:
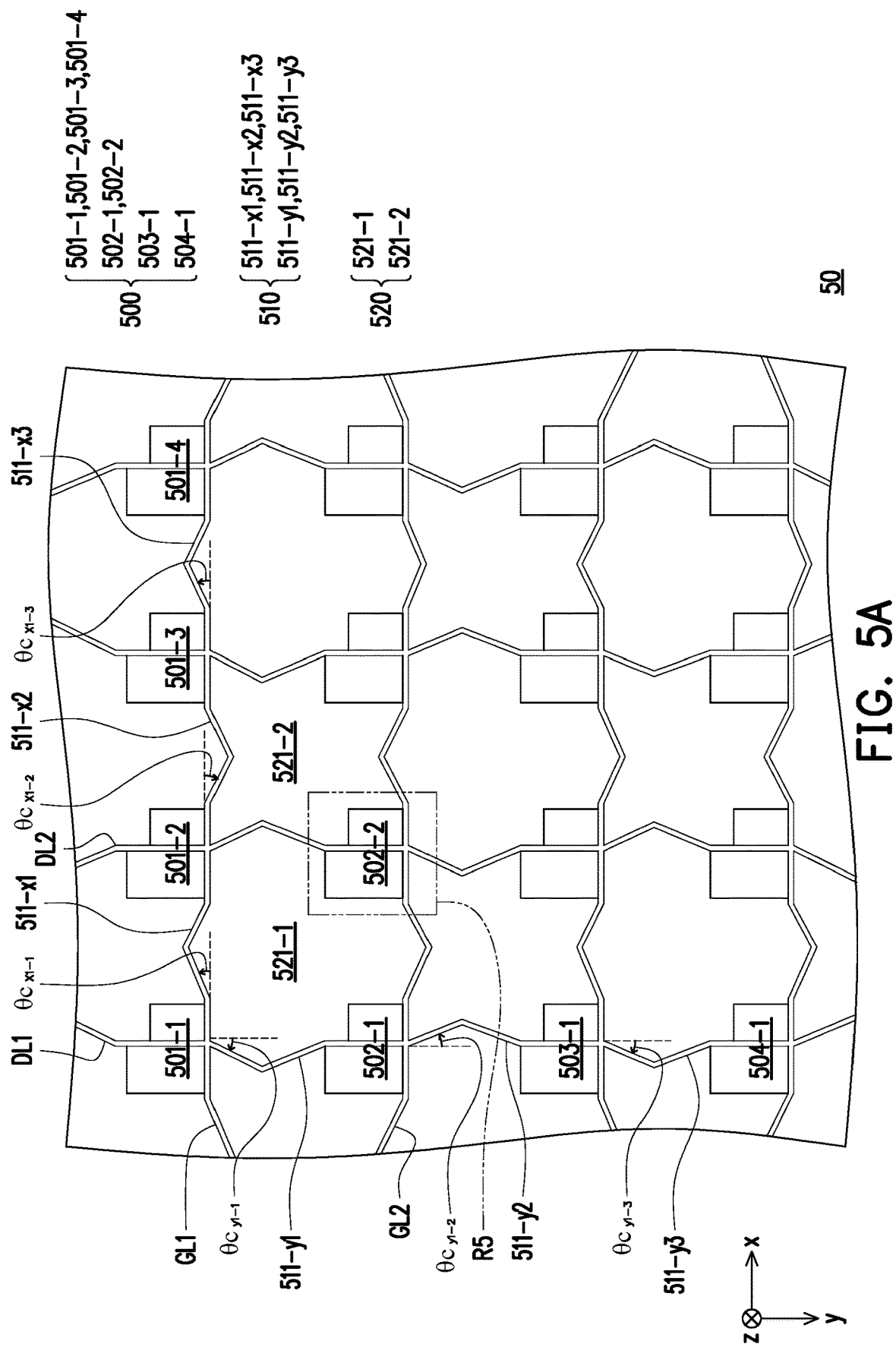
FIG. 5A is a schematic top view of a display panel according to an embodiment of the invention.
Figure 5B:
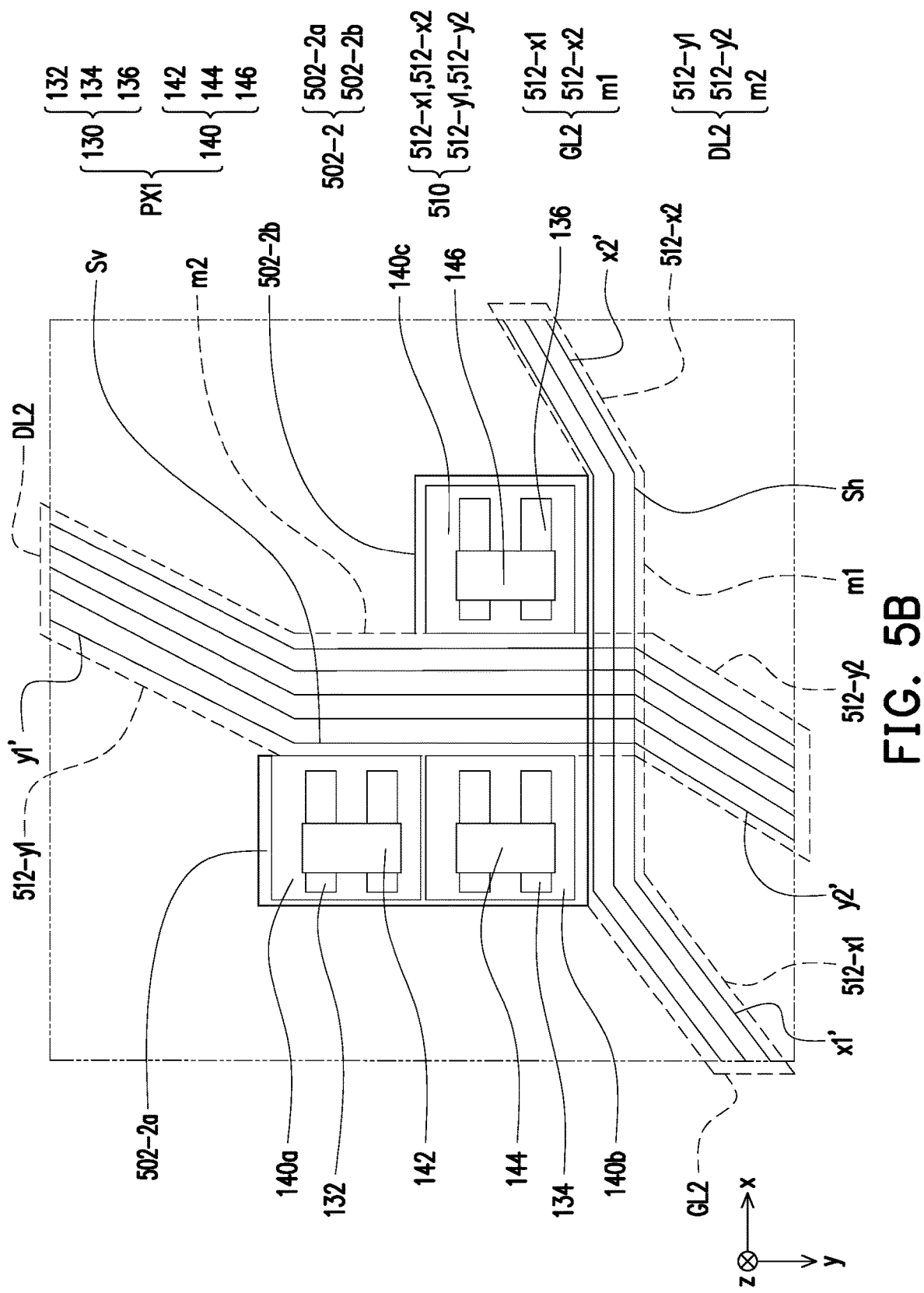
FIG. 5B is a partial enlarged schematic top view of the display panel of FIG. 5A.

FIG. 5A is a schematic top view of a display panel according to an embodiment of the invention. FIG. 5B is a partial enlarged schematic top plan view of a region R5 of the display panel of FIG. 5A. It should be noted here that the embodiment of FIG. 5A and FIG. 5B adopts the reference numerals and a portion of the content of the embodiment of FIG. 1A and FIG. 1C, wherein the same or similar elements are denoted by the same or similar reference numerals, and the description of the same technical content is omitted. For the description of the omitted portion, reference may be made to the above embodiments, which is not repeated herein.

Referring to FIG. 5, a display panel 50 includes a plurality of driving electrode regions 500 and a plurality of wiring regions 510, and the plurality of wiring regions 510 are connected between the driving electrode regions 500. The driving electrode regions 500 may be sequentially arranged along the arrangement direction to form a periodic array, and the arrangement direction may be, for example, the x-direction or the y-direction perpendicular to the x-direction. The (2n-1)th wiring region 510 extended from the (2n−1)th driving electrode region 500 toward the (2n)th driving electrode region 500 has a wiring extending direction forming a positive included angle with the arrangement direction, and the (2n)th wiring region 510 extended from the (2n)th driving electrode region 500 toward the (2n+1)th driving electrode region 500 has a wiring extending direction forming a negative included angle with the arrangement direction, wherein n is a positive integer. For example, included angles $\theta c_{x10-1}$, $\theta c_{x1-2}$, and $\theta c_{x1-3}$ of wiring regions 511-x1, 511-x2, and 511-x3 with the x-direction between adjacent driving electrode regions 501-1, 501-2, 501-3, and 501-4 are in an alternating positive and negative configuration. Included angles $\theta c_{y1-1}$, $\theta c_{y1-2}$, and $\theta c_{y1-3}$ of wiring regions 511-y1, 511-y2, and 511-y3 and the y-direction between adjacent driving electrode regions 501-1, 502-1, 503-1, and 504-1 are in an alternating positive and negative configuration.

Different from the display panel 10, in the present embodiment, each of the driving electrode regions 500 includes separate sub-driving electrode regions. For example, a driving electrode region 502-2 includes a sub-driving electrode region 502-2a and a sub-driving electrode region 502-2b. The pixel units disposed in the driving electrode region 502-2 may include micro-LEDs 142, 144, and 146. For example, the micro-LEDs 142 and 144 may be disposed in the sub-driving electrode region 502-2a, and the micro-LED 146 may be disposed in the sub-driving electrode region 502-2b, but the invention is not limited thereto.

In the present embodiment, the display panel 50 further includes middle wiring regions m1 and m2 connected between adjacent wiring regions 510 and disposed side by side with the driving electrode regions 500. The middle wiring regions m1 and m2 may be extended along the x-direction or the y-direction, but the invention is not limited thereto. Specifically, a plurality of wirings may be disposed in the same gate circuit region GL, and the wirings in the corresponding segments of two wiring regions 510 adjacent to two sides of the same driving electrode region 500 may have the same extending direction but not on the same line. The middle wiring of the middle wiring region m1 may connect the wirings in the corresponding segments of the two wiring regions 510 adjacent to two sides of the same driving electrode region 500 and arrange them on one side of the driving electrode region 500 without overlapping with the driving electrode region 500.

For example, as shown in FIG. 5B, in the gate line region GL2, the second segment located in a wiring region 512-x1 and the first segment located in a wiring region 512-x2 are two segments adjacent to the driving electrode region 502-2. The extending direction of a wiring x1' located in the second segment of the wiring region 512-x1 and the extending direction of a wiring x2' located in the first segment of the wiring region 512-x2 are the same but not on the same line. A middle wiring Sh of the middle wiring region m1 is a wiring extended along the x-direction, connecting the wiring x1' and the wiring x2' to form a continuous signal line (such as a gate line). In other words, the gate line region GL2 may include the wiring regions 512-x1 and 512-x2 and the middle wiring region m1 connected between the wiring regions 512-x1 and 512-x2. The middle wiring Sh is arranged on the lower side of the sub-driving electrode region 502-2a and the sub-driving electrode region 502-2b, and is not overlapped with the sub-driving electrode regions 502-2a and 502-2b.

Similarly, a plurality of wirings may be disposed in the same data line region DL, corresponding segments of two wiring regions 510 adjacent to two sides of the same data line region DL have the same extending direction but are not on the same line, the middle wiring of the middle wiring region m2 may connect the wirings in the corresponding segments of the two wiring regions 510 adjacent to two sides of the same driving electrode region 500, and arrange them on one side of the driving electrode region 500 without overlapping with the driving electrode region 500.

For example, as shown in FIG. 5B, in the data line region DL2, the second segment located in a wiring region 512-y1 and the first segment located in a wiring region 512-y2 are two segments adjacent to the driving electrode region 502-2. The extending direction of a wiring y1' located in the second segment of the wiring region 512-y1 and the extending direction of a wiring y2' located in the first segment of the wiring region 512-y2 are the same but not on the same line. A middle wiring Sv of the middle wiring region m2 is a wiring extended along the y-direction, connecting the wiring y1' and the wiring y2' to form a continuous signal line (such as a data line). In other words, the data line regions DL2 may include the wiring regions 512-y1 and 512-y2 and the middle wiring region m2 connected between the wiring regions 512-y1 and 512-y2. The middle wiring Sv is arranged between the sub-driving electrode region 502-2a and the sub-driving electrode region 502-2b, and is not overlapped with the sub-driving electrode regions 502-2a and 502-2b. In the present embodiment, the projection of the driving electrode regions 500 in the z-direction is not overlapped with the projection of the wiring of the wiring regions 510 in the z-direction. For example, the sub-driving electrode region 502-2a and the sub-driving electrode region 502-2b are separated by the data line region DL2, the lower side edge of the sub-driving electrode region 502-2a may be close to the upper side edge of the middle wiring region m1, the right side edge of the sub-driving electrode region 502-2a may be close to the left side edge of the middle wiring region m2, the lower side edge of the sub-driving electrode region 502-2b may be close to the upper side edge of the middle wiring region m1, and the left side edge of the sub-driving electrode region 502-2b may be close to the right side edge of the middle wiring region m2.

In the present embodiment, the driving electrode regions 500 and the wiring regions 510 may enclose a plurality of transmission regions 520, and two adjacent transmission regions 520 arranged along the arrangement direction of the driving electrode regions 500 have different geometric shapes and different areas. For example, as shown in FIG. 5A, the transmission regions 520 having the same shape as a transmission region 521-1 and the transmission regions 520 having the same shape as a transmission region 521-2 are staggered in the arrangement direction, and the area of the transmission region 521-1 is greater than the area of the transmission region 521-2.

Figure 6A:
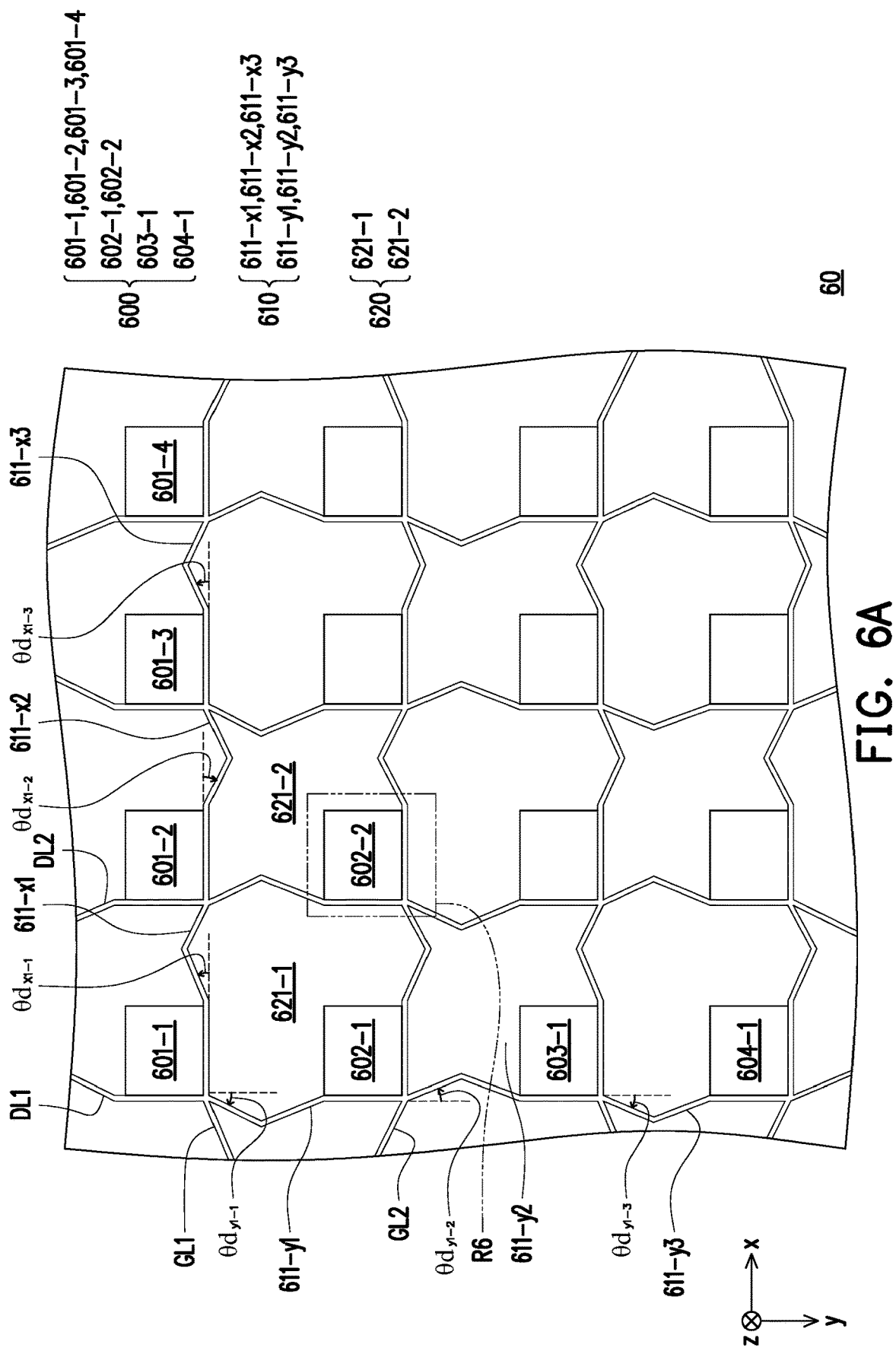
FIG. 6A is a schematic top view of a display panel according to an embodiment of the invention.
Figure 6B:
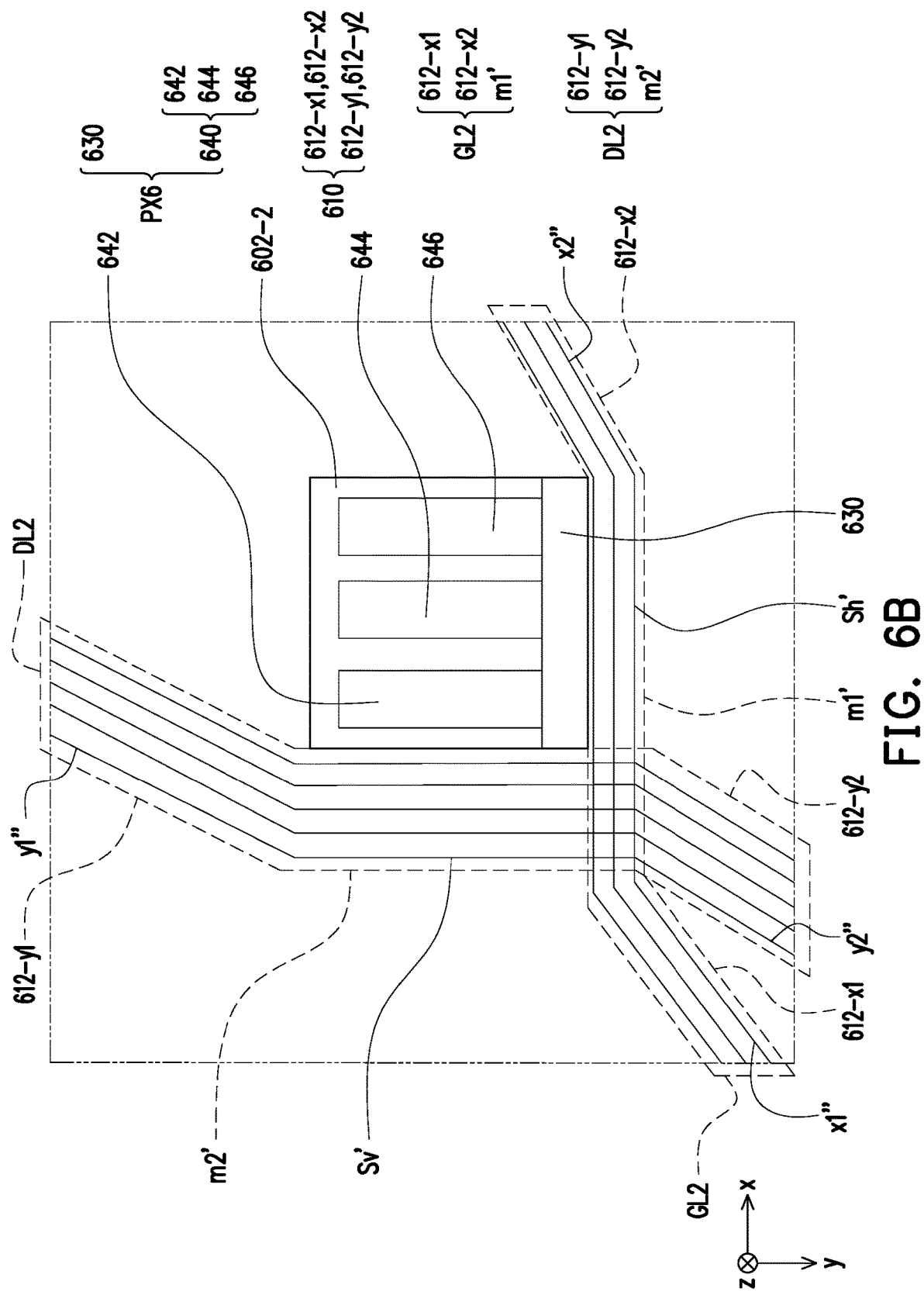
FIG. 6B is a partial enlarged schematic top view of the display panel of FIG. 6A.

FIG. 6A is a schematic top view of a display panel according to an embodiment of the invention. FIG. 6B is a partial enlarged top plan view of a region R6 of the display panel of FIG. 6A. It should be mentioned here that, the embodiment of FIG. 6A and FIG. 6B adopts the reference numerals and a portion of the content of the embodiment of FIG. 1A and FIG. 1C, wherein the same or similar elements are denoted by the same or similar reference numerals, and the description of the same technical content is omitted. For the description of the omitted portion, reference may be made to the above embodiments, which is not repeated herein.

Referring to FIG. 6A and FIG. 6B, a display panel 60 includes a plurality of driving electrode regions 600 and a plurality of wiring regions 610, and the plurality of wiring regions 610 are connected between the driving electrode regions 600. The driving electrode regions 600 may be sequentially arranged along the arrangement direction to form a periodic array, and the arrangement direction may be, for example, the x-direction or the y-direction perpendicular to the x-direction. The (2n−1)th wiring region 610 extended from the (2n−1)th driving electrode region 600 toward the (2n)th driving electrode region 600 has a wiring extending direction forming a positive included angle with the arrangement direction, and the (2n)th wiring region 610 extended from the (2n)th driving electrode region 600 toward the (2n+1)th driving electrode region 600 has a wiring extending direction forming a negative included angle with the arrangement direction, wherein n is a positive integer. For example, included angles $\theta d_{x1-1}$, $\theta d_{x1-2}$, and $\theta d_{x1-3}$ of wiring regions 611-x1, 611-x2, and 611-x3 with the x-direction between adjacent driving electrode regions 601-1, 601-2, 601-3, and 601-4 are in an alternating positive and negative configuration. Included angles $\theta d_{y1-1}$, $\theta d_{y1-2}$, and $\theta d_{y1-3}$ of wiring regions 611-y1, 611-y2, and 611-y3 and the y-direction between adjacent driving electrode regions 601-1, 602-1, 603-1, and 604-1 are in an alternating positive and negative configuration.

Different from the display panel 10, in the present embodiment, a plurality of wirings may be disposed in the same gate circuit region GL, and the wirings in the corresponding segments of two wiring regions 610 adjacent to two sides of the same driving electrode region 600 may have the same extending direction but not on the same line. The middle wiring in a middle wiring region m1' may connect the wirings in the corresponding segments of the two wiring regions 610 adjacent to two sides of the same driving electrode region 600, and arrange them on one side of the driving electrode region 600 without overlapping with the driving electrode region 600.

For example, as shown in FIG. 6B, in the gate line region GL2, the second segment located in a wiring region 612-x1 and the first segment located in a wiring region 612-x2 are two segments adjacent to a driving electrode region 602-2. The extending direction of a wiring x1" located in the second segment of the wiring region 612-x1 and the extending direction of a wiring x2" located in the first segment of the wiring region 612-x2 may be substantially the same but not on the same line. A middle wiring Sh' of the middle wiring region m1' is a wiring extended along the x-direction, connecting the wiring x1" and the wiring x2" to form a continuous signal line (e.g., a gate line). In other words, the gate line region GL2 may include the wiring regions 612-x1 and 612-x2 and the middle wiring region m1' connected between the wiring regions 612-x1 and 612-x2. The middle wiring Sh' is arranged on the lower side of the driving electrode region 602-2 and not overlapped with the driving electrode region 602-2.

Similarly, a plurality of wirings may be disposed in the same data line region DL, corresponding segments of two wiring regions 610 adjacent to two sides of the same data line region DL have the same extending direction but are not on the same line, the middle wiring of a middle wiring region m2' may connect the wirings in the corresponding segments of the two wiring regions 610 adjacent to two sides of the same driving electrode region 600, and arrange them on one side of the driving electrode region 600 without overlapping with the driving electrode region 600.

For example, as shown in FIG. 6B, in the data line region DL2, the second segment located in a wiring region 612-y1 and the first segment located in a wiring region 612-y2 are two segments adjacent to the driving electrode region 602-2. The extending direction of a wiring y1" located in the second segment of the wiring region 612-y1 and the extending direction of a wiring y2" located in the first segment of the wiring region 612-y2 are the same but not on the same line. A middle wiring Sv' of the middle wiring region m2' is a wiring extended along the y-direction, connecting the wiring y1" and the wiring y2" to form a continuous signal line (such as a data line). In other words, the data line region DL2 may include the wiring regions 612-y1 and 612-y2 and a middle wiring region m2' connected between the wiring regions 612-y1 and 612-y2. The middle wiring Sv' is arranged on the left side of the driving electrode region 602-2 and is not overlapped with the driving electrode region 602-2.

In the present embodiment, the projection of the driving electrode regions 600 in the z-direction is not overlapped with the projection of the wiring of the wiring regions 610 in the z-direction. For example, the lower side edge of the driving electrode region 602-2 may be close to the upper side edge of the middle wiring region m1', and the left side edge of the driving electrode region 602-2 may be close to the right side edge of the middle wiring region m2'.

In the present embodiment, the display panel 60 may be implemented by sandwiching a display medium between two substrates, but the two substrates and the display medium are stacked in the z-direction. Therefore, the two substrates and the display medium are not shown in the figure. In some embodiments, the display panel 60 further includes a pixel unit PX6, and the pixel unit PX6 includes a pixel circuit element 630 and a plurality of corresponding pixel electrodes 640 (e.g., pixel electrodes 642, 644, and 646). In some embodiments, the display medium of the display panel 60 is, for example, a liquid-crystal material driven via the pixel unit PX6 to achieve display function. The pixel unit PX6 may be disposed in the driving electrode regions 600, and the shape of the driving electrode regions 600 is, for example, a rectangle, but not limited thereto. The pixel circuit element 630 is, for example, a TFT and is electrically connected to the corresponding plurality of pixel electrodes 640.

In the present embodiment, the driving electrode regions 600 and the wiring regions 610 may enclose a plurality of transmission regions 620, and two adjacent transmission regions 620 arranged along the arrangement direction of the driving electrode regions 600 have different geometric shapes and different areas. For example, as shown in FIG. 6A, the transmission regions 620 having the same shape as a transmission region 621-1 and the transmission regions 620 having the same shape as a transmission region 621-2 are staggered in the arrangement direction, and the area of the transmission region 621-1 is greater than the area of the transmission region 621-2.

Figure 7A:
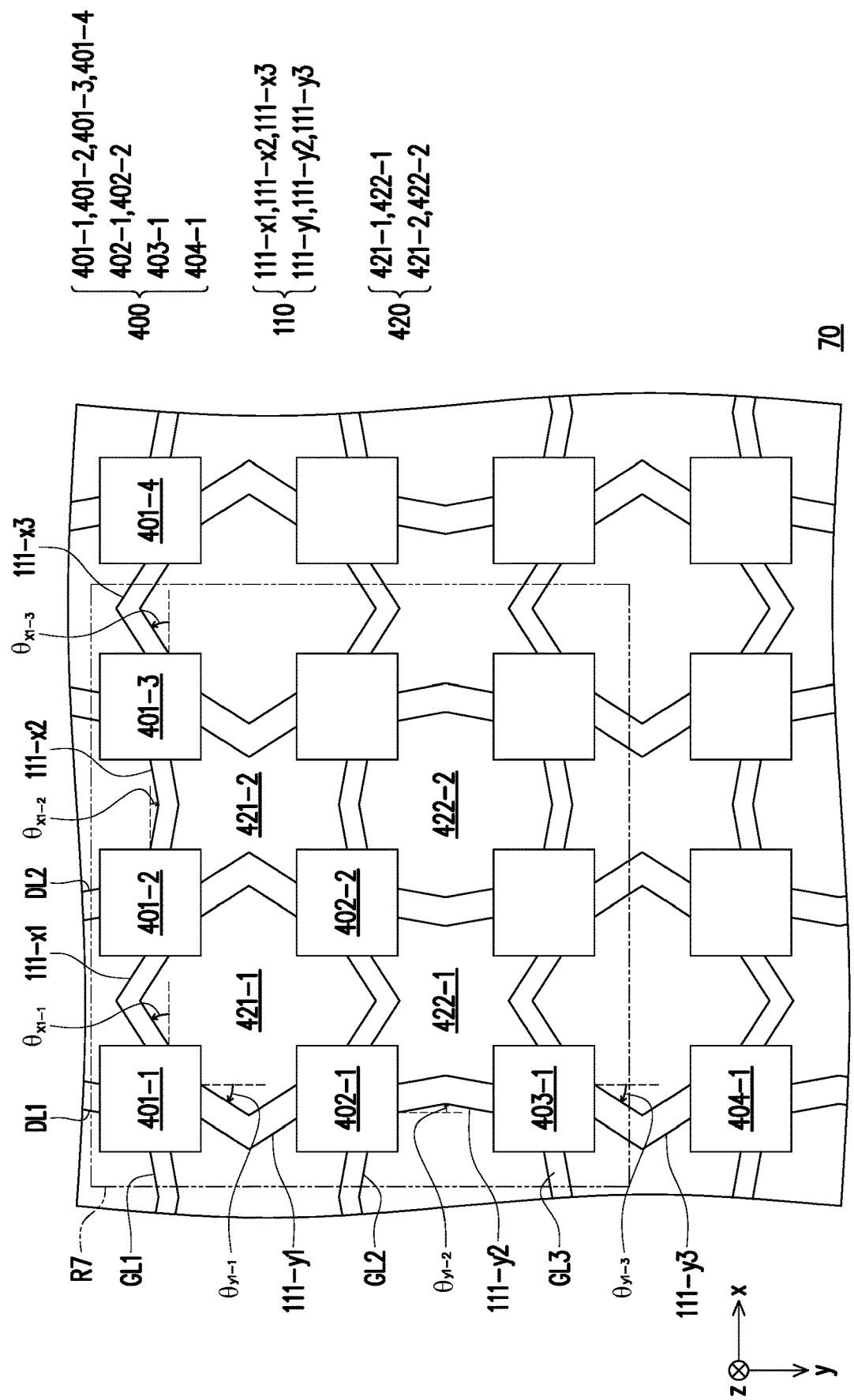
FIG. 7A is a schematic top view of a display panel according to an embodiment of the invention.
Figure 7B:
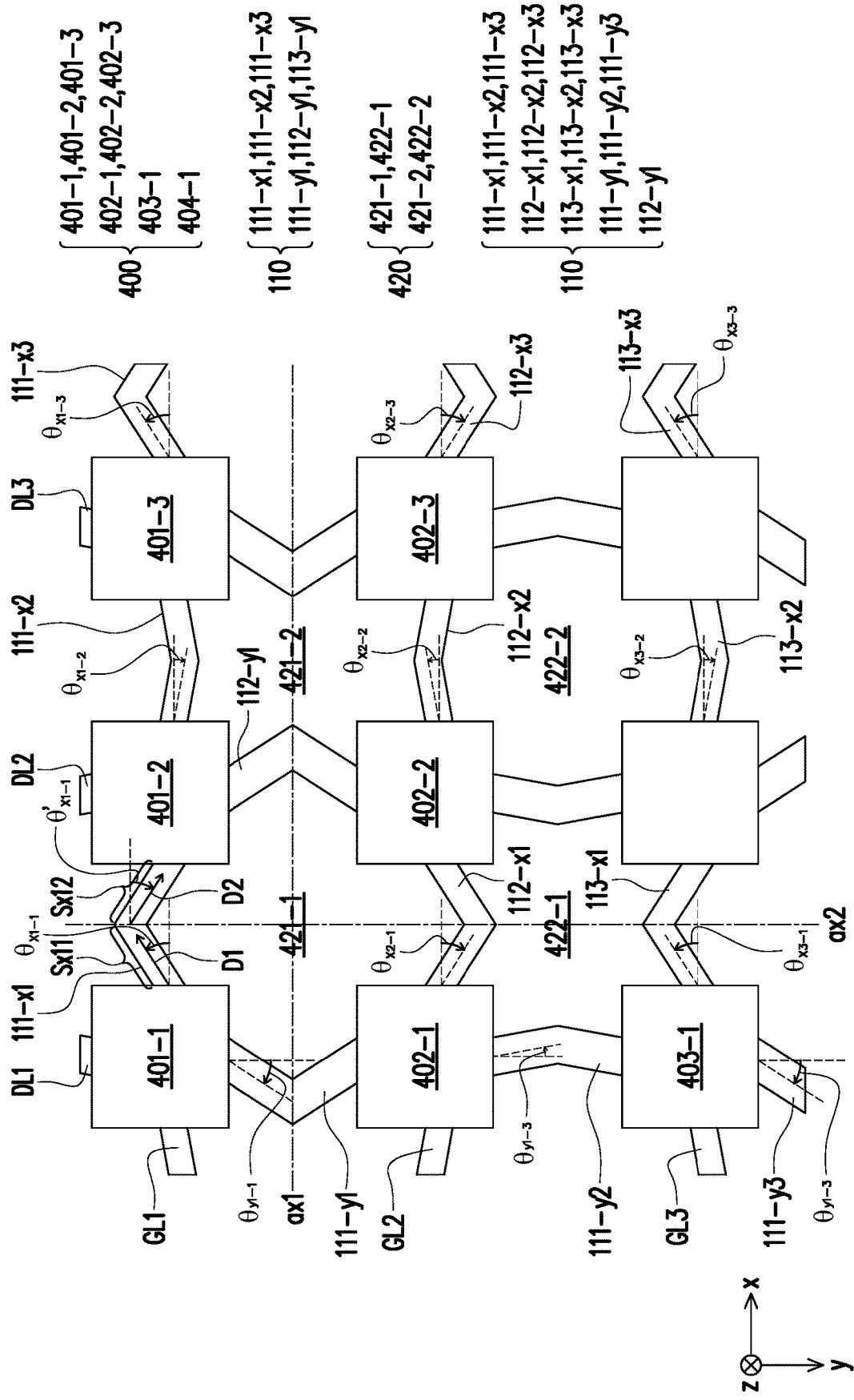
FIG. 7B is a partial enlarged schematic top view of the display panel of FIG. 7A.

FIG. 7A is a schematic top view of a display panel according to an embodiment of the invention. FIG. 7B is a partial enlarged schematic top view of a region R7 of the display panel of FIG. 7A. It should be mentioned here that, the embodiment of FIG. 7A and FIG. 7B adopts the reference numerals and a portion of the content of the embodiment of FIG. 4A and FIG. 1C, wherein the same or similar elements are denoted by the same or similar reference numerals, and the description of the same technical content is omitted. For the description of the omitted portion, reference may be made to the above embodiments, which is not repeated herein.

Referring to FIG. 7A and FIG. 7B, the display panel 70 in the present embodiment is similar to the display panel 40 in FIGS. 4A and 4B. Different from the display panel 40, in the present embodiment, the angles of the included angle of the wiring extending direction of the two adjacent wiring regions 110 contained in the same gate line region GL or the same data line region DL are different. For example, the wiring regions 111-x1, 111-x2, and 111-x3 are contained in the gate line region GL1, the angle of the included angle $\theta_{x1-1}$ and the angle of the included angle $\theta_{x1-2}$ are different, and the angle of the included angle $\theta_{x1-2}$ and the angle of the included angle $\theta_{x1-3}$ are different. On the other hand, the wiring regions 111-y1, 111-y2, and 111-y3 are contained in the data line region DL1, the angle of the included angle $\theta_{y1-1}$ and the angle of the included angle $\theta_{y1-2}$ are different, and the angle of the included angle $\theta_{y1-2}$ and the angle of the included angle $\theta_{y1-3}$ are different.

In the present embodiment, in the gate line region GL1, the included angles of the wiring extending direction of the wiring regions 110 are set alternatively with $\theta_{x1-1}$ and $\theta_{x1-2}$.

That is to say, the angle and the sign of the included angle $\theta_{x1-1}$ is substantially the same as the angle and the sign of the included angle $\theta_{x1-3}$. The wiring extending direction of the wiring regions 110 contained in the same gate line region GL are periodically repeated every two wiring regions as a cycle. Similarly, in the data line region DL1, the included angles of the wiring extending direction of the wiring regions 110 are set alternatively with $\theta_{y1-1}$ and $\theta_{y1-2}$. That is to say, the angle and the sign of the included angle $\theta_{y1-1}$ is substantially the same as the angle and the sign of the included angle $\theta_{y1-3}$. The wiring extending direction of the wiring regions 110 contained in the same data line region DL are periodically repeated every two wiring regions as a cycle.

In FIGS. 7A and 7B, two adjacent gate line regions GL are symmetrical about each other, and two adjacent data line regions DL are symmetrical about each other, but not limited thereto.

In FIG. 7A, two adjacent transmission regions 420 arranged along the arrangement direction have different geometric shapes, and every other transmission region 420 in the arrangement direction may have substantially the same geometric shape. For example, in the view of the x-direction, transmission regions 421-1 and 421-2 are arranged in the same row along the x-direction. The transmission region 421-1 enclosed by the driving electrode regions 401-1, 401-2, 402-1, and 402-2 and the wiring regions 111-x1, 112-x1, 111-y1, and 112-y1 has a first shape similar to a convex octagon. The transmission region 421-2 enclosed by the driving electrode regions 101-2, 101-3, 102-2, and 102-3 and the wiring regions 111-x2, 112-x2, 112-y1, and 113-y1 has a second shape similar to a star. The first shape and the second shape are different and arranged alternatively along the row between the gate line regions GL1 and GL2. On the other hand, transmission regions 422-1 and 422-2 are arranged in the same row along the x-direction and next to the row of the transmission regions 421-1 and 421-2. The transmission region 422-1 next to the transmission region 421-1 along the y direction has a third shape similar to a star. The transmission region 422-2 arranged sequentially with the transmission region 422-1 along the x-direction and next to the transmission regions 421-2 has a fourth shape similar to a convex octagon. The third shape and the fourth shape are different and arranged alternatively along the row between the gate line regions GL2 and GL3. It is appreciated that the above arrangement can also be found in the view of the y-direction.

In some embodiments, the first shape, the second shape, the third shape and the fourth shape are different from each other. That is to say, the transmission regions 420 arranged in adjacent rows/columns along the arrangement direction have at least four different geometric shapes. In some embodiments, the transmission regions 420 enclosed by any 3×3 array of driving electrode regions with its corresponding wiring regions have different shapes.

Since the angles of the included angle of the wiring extending direction of the two adjacent wiring regions contained in the same gate line region GL or the same data line region DL are different, the diffraction intensity of high-frequency terms can further be reduced to prevent image distortion, such that the image quality of the display panel 40a is improved.

Figure 8A:
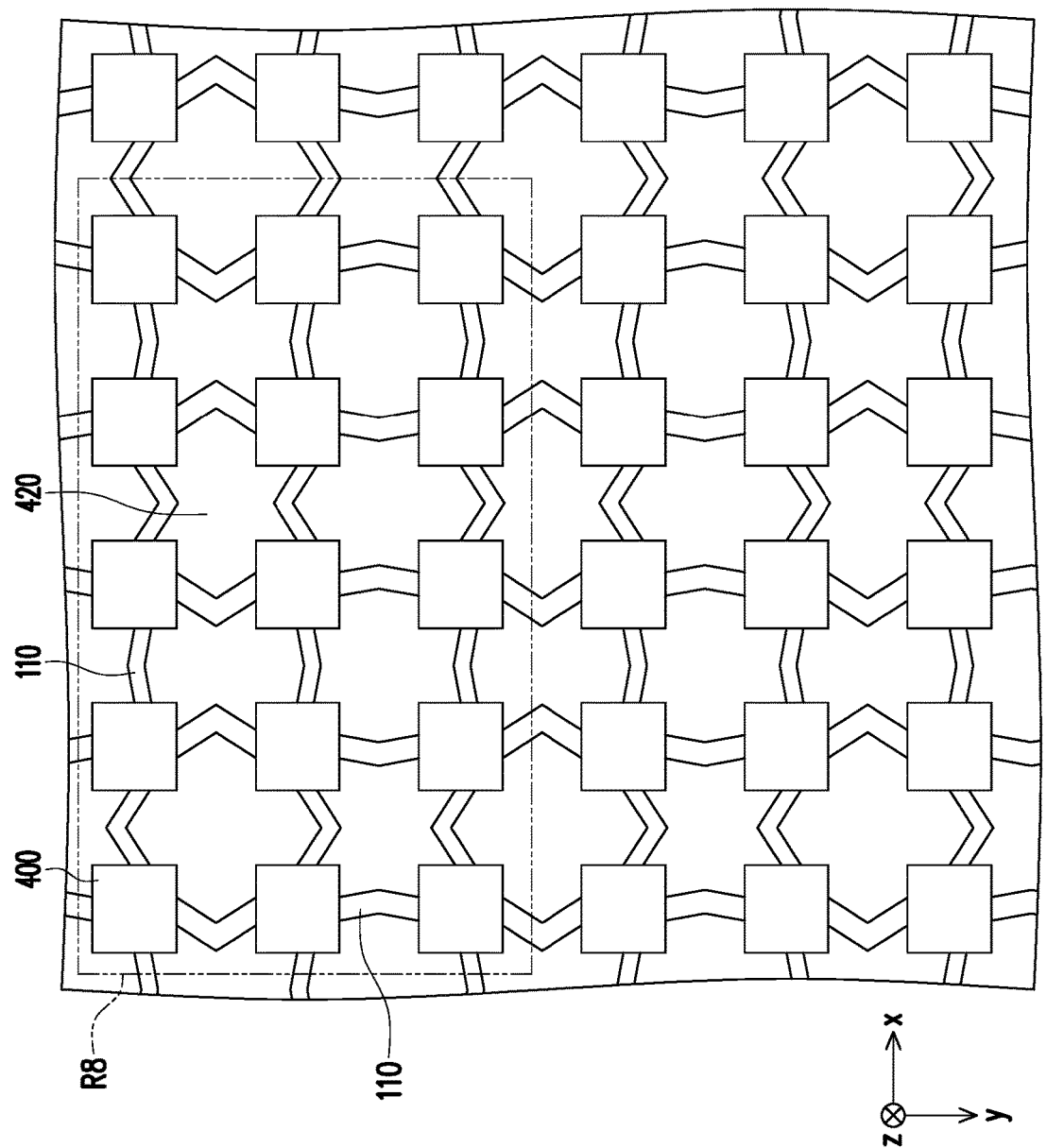
FIG. 8A is a schematic top view of a display panel according to an embodiment of the invention.
Figure 8B:
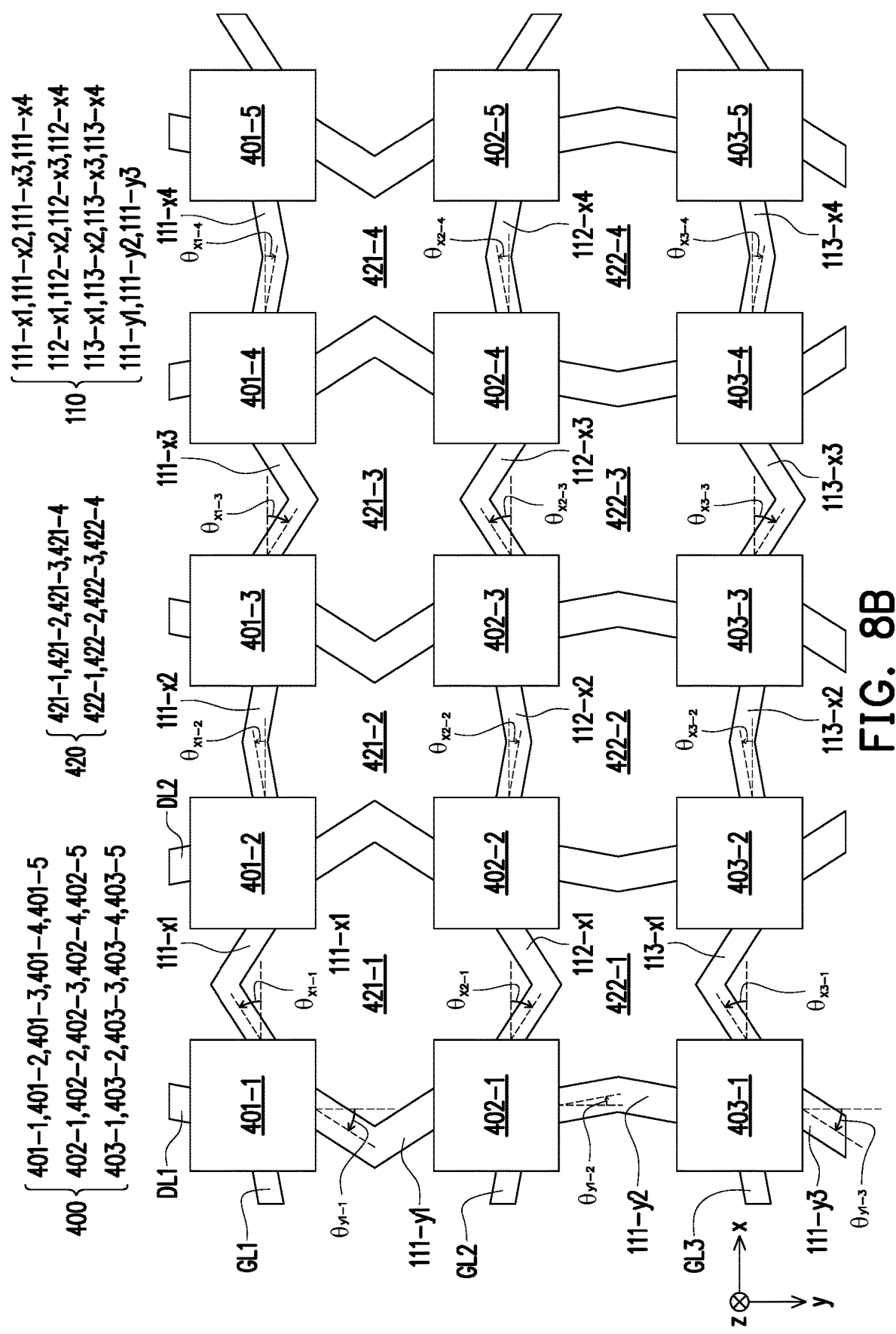
FIG. 8B is a partial enlarged schematic top view of the display panel of FIG. 8A.

FIG. 8A is a schematic top view of a display panel according to an embodiment of the invention. FIG. 8B is a partial enlarged schematic top view of a region R8 of the display panel of FIG. 8A. It should be mentioned here that, the embodiment of FIG. 8A and FIG. 8B adopts the reference numerals and a portion of the content of the embodiment of FIG. 7A and FIG. 7B, wherein the same or similar elements are denoted by the same or similar reference numerals, and the description of the same technical content is omitted. For the description of the omitted portion, reference may be made to the above embodiments, which is not repeated herein.

Referring to FIG. 8A and FIG. 8B, a display panel 80 includes a plurality of driving electrode regions 400 and the plurality of wiring regions 110, and the plurality of wiring regions 110 are connected between the driving electrode regions 400. The driving electrode regions 400 may be sequentially arranged along the arrangement direction to form a periodic array, and the arrangement direction may be, for example, the x-direction or the y-direction perpendicular to the x-direction. The (2n−1)th wiring region 110 extended from the (2n−1)th driving electrode region 400 toward the (2n)th driving electrode region 400 has a wiring extending direction forming a first included angle with the arrangement direction, the (2n)th wiring region 110 extended from the (2n)th driving electrode region 400 toward the (2n+1)th driving electrode region 400 has a wiring extending direction forming a second included angle with the arrangement direction, and the (2n+1)th wiring region 110 extended from the (2n+1)th driving electrode region 400 toward the (2n+2)th driving electrode region 400 has a wiring extending direction forming a third included angle with the arrangement direction wherein n is a positive integer. At least one of the first included angle, the second included angle and the third included angle is positive and at least one of the first included angle, the second included angle and the third included angle is negative. For example, the included angles $\theta_{x1-1}$ and $\theta_{x1-2}$ of the wiring regions 111-x1 and 111-x2 are positive, and the included angle of the wiring region 111-x3 are negative. The included angles $\theta_{y1-1}$ and $\theta_{y1-2}$ of the wiring regions 111-y1 and 111-y2 are negative, and the included angle $\theta_{y1-3}$ of the wiring region 111-y3 are positive.

The display panel 80 in the present embodiment is similar to the display panel 70 in FIGS. 7A and 7B. Different from the display panel 70, in the present embodiment, in at least one of the gate line regions GL, the included angles of the wiring extending directions of the wiring regions 110 are repeated periodically in an order of +Φa, +Φb, −Φa and −Φb, along the x-direction; in at least one of the data line regions DL, the included angles of the wiring extending directions of the wiring regions 110 are repeated periodically in an order of −Φc and +Φd, along the y-direction, where |Φa| and |Φb| are different from each other, and |Φc| and |Φd| are different from each other. In some embodiments, |Φa|, |Φb|, |Φc| and |Φd| are each in a range of 5 degrees to 44 degrees. In some embodiments, Φa, Φb, Φc and Φd are positive.

Specifically, in gate line region GL1, ψa=|$\theta_{x1-1}$| and Φb=|$\theta_{x1-2}$|. The wiring extending direction of the wiring region 111-x1 and the wiring extending direction of the wiring region 111-x3 have substantially the same angle Φa (that is, an angle of the included angle $\theta_{x1-1}$ is the same as an angle of the included angle $\theta_{x1-3}$, which means |$\theta_{x1-1}$|=|$\theta_{x1-3}$|=Φa) but opposite directions (where the included angle $\theta_{x1-1}$ is positive, and the included angle $\theta_{x1-3}$ is negative). The wiring extending direction of the wiring region 111-x2 and the wiring extending direction of the wiring region 111-x4 have substantially the same angle Φb (that is, an angle of the included angle $\theta_{x1-2}$ is the same as an angle of the included angle $\theta_{x1-4}$, which means |$\theta_{x1-2}$|=|$\theta_{x1-4}$|=Φb) but opposite directions (where the included angle $\theta_{x1-2}$ is positive, and the included angle $\theta_{x1-4}$ is negative). That is to say, the angles of the included angles of the wiring extending directions of the wiring regions 110 contained in gate line region GL1 are repeated periodically in an order of |$\theta_{x1-1}$| and |$\theta_{x1-2}$|, along the x-direction, and the signs of the included angles of the wiring extending directions of the wiring regions 110 in gate line region GL1 are repeated periodically in an order of positive, positive, negative and negative, along the x-direction. The wiring extending direction of the wiring regions 110 contained in the same gate line region GL are periodically repeated every four wiring regions as a cycle.

On the other hand, in data line region DL1, Φc=|$\theta_{y1-1}$| and Φd=|$\theta_{y1-2}$|. The wiring extending direction of the wiring region 111-y1 and the wiring extending direction of the wiring region 111-y3 have substantially the same angle Φc (that is, an angle of the included angle $\theta_{y1-1}$ is the same as an angle of the included angle $\theta_{y1-3}$, which means |$\theta_{y1-1}$|=|$\theta_{y1-3}$|=Φc) and the same directions (where the included angle $\theta_{y1-1}$ and the included angle $\theta_{y1-3}$ are both negative). The wiring extending direction of the wiring region 111-y2 is different from the wiring extending direction of the wiring regions 111-y1 and 111-y3, but the same as that of the wiring region (not shown in FIG. 8B) arranged in sequence after wiring region 111-y3 along the data line region DL1. That is to say, the angles of the included angles of the wiring extending directions of the wiring regions 110 contained in the data line region DL1 are repeated periodically in an order of |$\theta_{y1-1}$| and |$\theta_{y1-2}$|, along the y-direction, and the signs of the included angles of the wiring extending directions of the wiring regions 110 contained in the data line region DL1 are repeated periodically in an order of negative and positive, along the y-direction. The wiring extending direction of the wiring regions 110 contained in the same data line region DL are periodically repeated every two wiring regions as a cycle. Although FIGS. 8A and 8B illustrates that the included angles of the wiring extending directions of the wiring regions 110 in the same data line region DL are repeated periodically in an order of −Φc and +Φd, along the y-direction, but it is not limited thereto. The included angles of the wiring extending directions of the wiring regions 110 in the same data line region DL may be set similar as the aforementioned manner for the gate line region.

In FIGS. 8A and 8B, two adjacent gate line regions GL are symmetrical about each other, and two adjacent data line regions DL are symmetrical about each other, but not limited thereto.

In FIGS. 8A and 8B, the transmission regions 420 arranged in the same row along the x-direction have four different shapes repeated periodically. For example, the transmission regions 421-1, 421-2, 421-3, and 421-4 arranged in a row between gate line regions GL1 and GL2 have different shapes, and the shapes of the transmission regions in this row are periodically repeated in accordance with the transmission regions 421-1, 421-2, 421-3 and 421-4. Similarly, the transmission regions 422-1, 422-2, 422-3, and 422-4 arranged in a row between gate line regions GL2 and GL3 have different shapes, and the shapes of the transmission regions in this row are periodically repeated in accordance with the transmission regions 422-1, 422-2, 422-3 and 422-4. On the other hand, the transmission regions 420 arranged in the same column along the y-direction have two different shapes repeated periodically. For example, the transmission regions 421-1 and 422-1 arranged in a column between data line regions DL1 and DL2 have different shapes, and the shapes of the transmission regions in this column are periodically repeated in accordance with the transmission regions 421-1 and 422-1.

In some embodiments, the transmission regions 420 enclosed by any 3 (row)×5(column) array of driving electrode regions with its corresponding wiring regions have different shapes. That is, the transmission regions 421-1, 421-2, 421-3, 421-4, 422-1, 422-2, 422-3 and 422-4 may all have different shapes.

Figure 9:
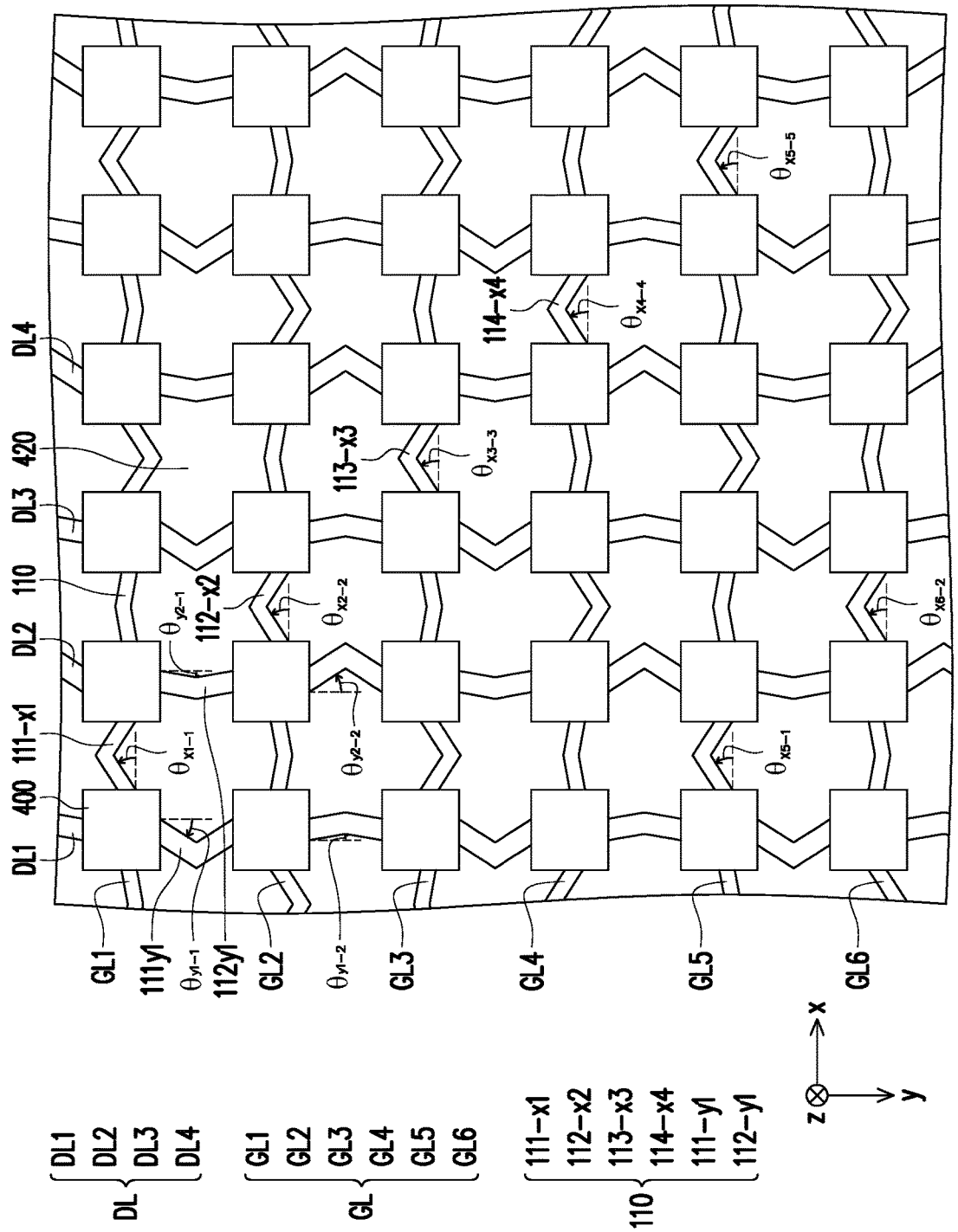
FIG. 9 is a schematic top view of a display panel according to an embodiment of the invention.

FIG. 9 is a schematic top view of a display panel according to an embodiment of the invention. It should be mentioned here that, the embodiment of FIG. 9 adopts the reference numerals and a portion of the content of the embodiment of FIG. 8A, wherein the same or similar elements are denoted by the same or similar reference numerals, and the description of the same technical content is omitted. For the description of the omitted portion, reference may be made to the above embodiments, which is not repeated herein.

Referring to FIG. 9, the display panel 90 in the present embodiment is similar to the display panel 80 in FIG. 8A. Different from the display panel 80, in the present embodiment, two adjacent gate line regions GL are not symmetrical about each other, and two adjacent data line regions DL are not symmetrical about each other.

Specifically, the included angles of the wiring extending directions of the wiring regions 110 in each of the gate line regions GL are repeated periodically in an order of +Φa, +Φb, −Φa and −Φb, along the x-direction, and the gate line regions are shifted from each other. For example, the wiring region 111-*x*1 in the gate line region GL1 and the wiring region 112-*x*2 in the gate line region GL2 have substantially the same wiring extending direction with an included angle +Φa (which means $\theta_{x1-1}=\theta_{x2-2}=+\Phi a$), and starting from the wiring regions 111-*x*1 and 112-*x*2 respectively, the included angles of the extending directions of wiring regions 110 in the gate line regions GL1 and GL2 are repeated periodically in the order of +Φa, +Φb, −Φa and −Φb, along the x-direction. This shows that the wiring region 112-*x*2 is shifted one driving electrode region pitch to the right in the x-direction relative to the wiring region 111-*x*1, where the driving electrode region pitch is defined as a distance between centers of two adjacent driving electrode regions. Similarly, the wiring region 113-*x*3 in the gate line region GL3 having substantially the same wiring extending direction with an included angle +Φa (which means $\theta_{x1-3}=+\Phi a$) is shifted one driving electrode region pitch to the right in the x-direction relative to the wiring region 112-*x*2, and the wiring region 114-*x*4 in the gate line region GL4 having substantially the same wiring extending direction with an included angle +Φa (which means $\theta_{x1-4}=+\Phi a$) is shifted one driving electrode region pitch to the right in the x-direction relative to the wiring region 113-*x*3. That is to say, any one of the gate line region GL is shifted one driving electrode region pitch in the x-direction relative to its adjacent gate line region GL. Although FIG. 9 illustrates the gate line region GL (such as GL1) is shifted one driving electrode region pitch in the x-direction relative to its adjacent gate line region GL (such as GL2), but it is not limited and can be adjusted by design. In other embodiments, the gate line region GL (such as GL1) can be shifted two or more driving electrode region pitches in the x-direction relative to its adjacent gate line region GL (such as GL2).

Since the included angles of the wiring extending directions of the wiring regions 110 in each of the gate line regions GL are repeated periodically in an order of +Φa, +Φb, −Φa and −Φb, along the x-direction, every four gate line regions GL form a cycle, such that the wiring extending direction of the gate line region GL5 has substantially the same trend as the wiring extending direction of the gate line region GL1, the wiring extending direction of the gate line region GL6 has substantially the same trend as the wiring extending direction of the gate line region GL2, and so on.

Although it is illustrated that all of the gate line regions (GL1, GL2, GL3, GL4, GL5 and GL6) in FIG. 9 are shifted relative to their adjacent gate line regions, but it is not limited. It is appreciated that any one of the gate line regions GL can either have the same wiring extending direction, opposite wiring extending direction or shift wiring extending direction relative to its adjacent gate line region GL.

On the other hand, the included angles of the wiring extending directions of the wiring regions 110 in some data line regions DL are repeated periodically in an order of −Φc, and +Φd, along the y-direction, and the included angles of the wiring extending directions of the wiring regions 110 in the other data line regions DL are repeated periodically in an order of −Φd, and +Φc, along the y-direction. For example, the included angles of the wiring extending directions of the wiring regions 110 in the data line region DL1 are repeated periodically in an order of −Φc, and +Φd (which means $\theta_{y1-1}=-\Phi c$, and $\theta_{y1-2}=+\Phi d$), and the included angles of the wiring extending directions of the wiring regions 110 in the data line region DL2 are repeated periodically in an order of −Φd, and +Φc (which means $\theta_{y2-1}=-\Phi d$, and $\theta_{y2-2}=+\Phi c$). This shows that in FIG. 9, the product of the included angles with the y-direction of the wiring extending directions of the two adjacent and corresponding wiring regions 110 (such as 111-*y*1 and 112-*y*1) located at the adjacent data line regions DL respectively (such as DL1 and DL2) is a positive value.

In some embodiments, the data line regions DL are arranged in the x-direction and repeated periodically with the data line regions DL1 and DL2. That is, the wiring extending direction of the data line region DL3 has substantially the same trend as the wiring extending direction of the data line region DL1, the wiring extending direction of the data line region DL4 has substantially the same trend as the wiring extending direction of the data line region DL2, and so on.

Although it is illustrated that the data line regions DL1 and DL2 are arranged alternatively in the x-direction to form the data line regions DL in FIG. 9, but it is not limited. It is appreciated that any one of the data line regions DL can either have the same wiring extending direction, opposite wiring extending direction or shift wiring extending direction relative to its adjacent data line region DL.

Figure 10A:
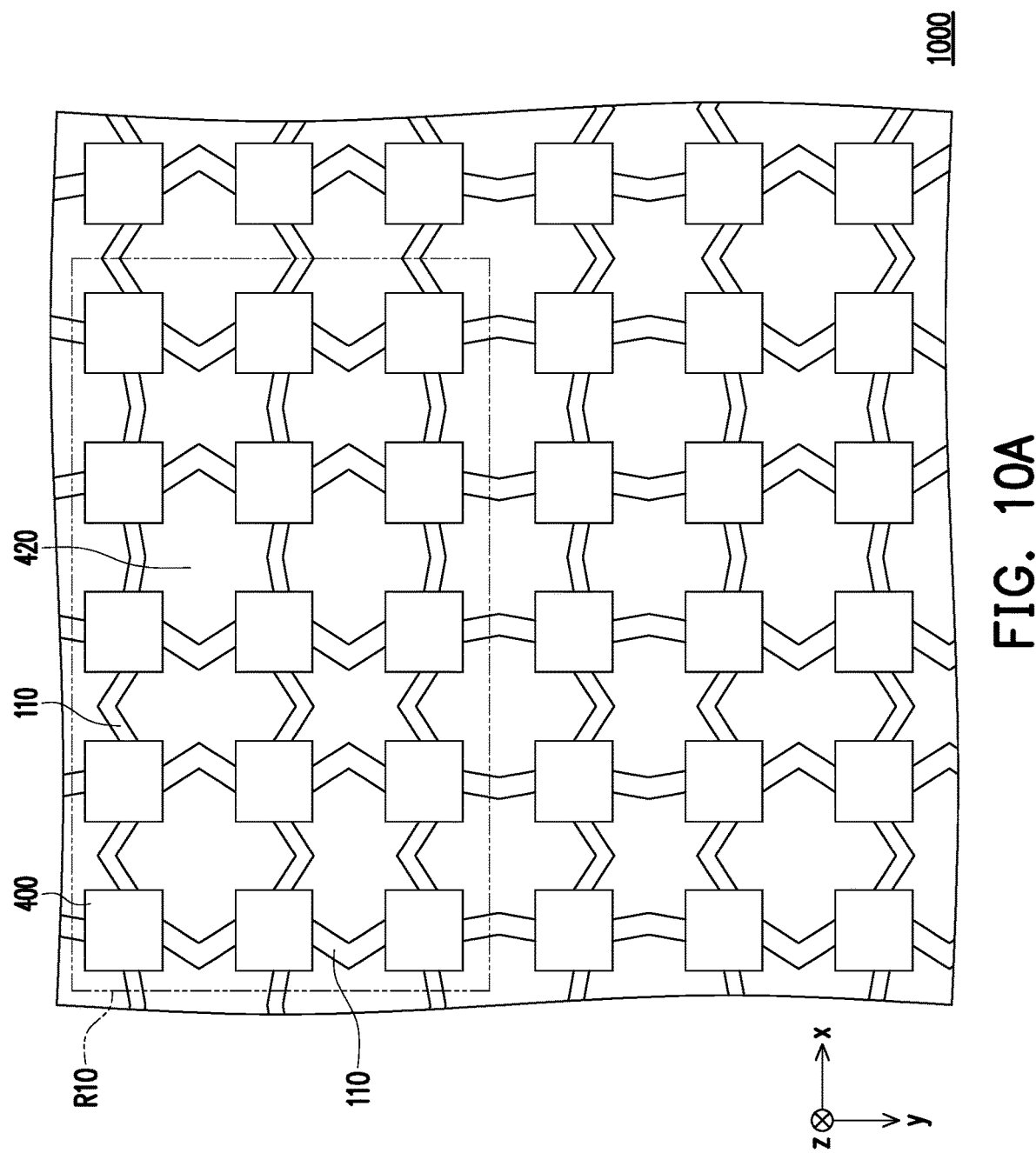
FIG. 10A is a schematic top view of a display panel according to an embodiment of the invention.
Figure 10B:
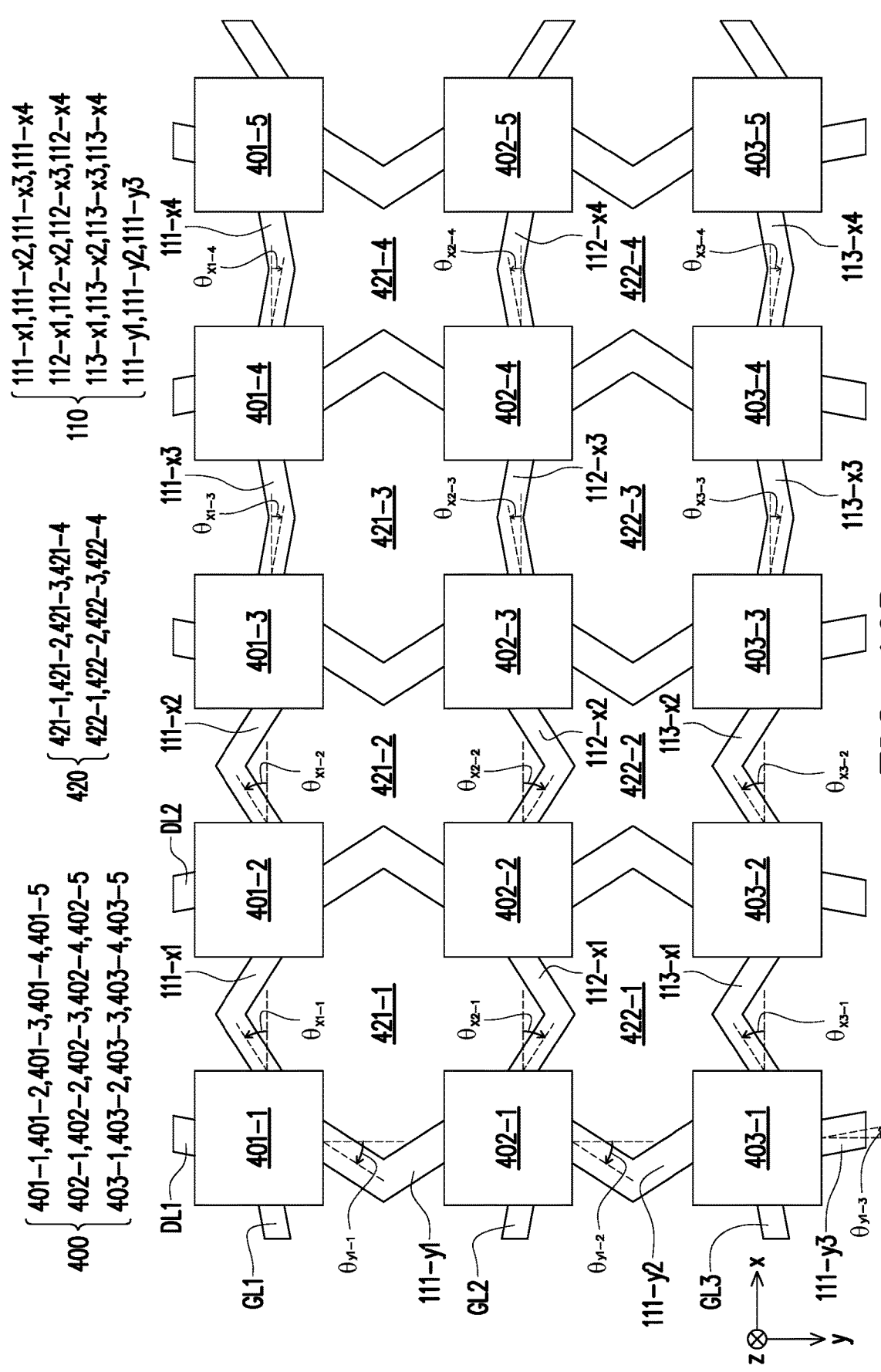
FIG. 10B is a partial enlarged schematic top view of the display panel of FIG. 10A.

FIG. 10A is a schematic top view of a display panel according to an embodiment of the invention. FIG. 10B is a partial enlarged schematic top view of a region R10 of the display panel of FIG. 10A. It should be mentioned here that, the embodiment of FIG. 10A and FIG. 10B adopts the reference numerals and a portion of the content of the embodiment of FIG. 8A and FIG. 8B, wherein the same or similar elements are denoted by the same or similar reference numerals, and the description of the same technical content is omitted. For the description of the omitted portion, reference may be made to the above embodiments, which is not repeated herein.

Referring to FIG. 10A and FIG. 10B, the display panel 1000 in the present embodiment is similar to the display panel 80 in FIGS. 8A and 8B. Different from the display panel 80, in the present embodiment, in at least one of the gate line regions GL, the included angles of the wiring extending directions of the wiring regions 110 are repeated periodically in an order of +Φa, +Φa, −Φb and −Φb, along the x-direction; in at least one of the data line regions DL, the included angles of the wiring extending directions of the wiring regions 110 are repeated periodically in an order of −Φc, −Φc, +Φd and +Φd, along the y-direction, where |θa| and |Φb| are different from each other, and |Φc| and |Φd| are different from each other. In some embodiments, |θa|, |Φb|, |Φc| and |Φd| are each in a range of 5 degrees to 44 degrees. In some embodiments, Φa, Φb, Φc and Φd are positive.

Specifically, in gate line region GL1, Φa=|θ$_{x1-1}$| and Φb=|θ$_{x1-3}$|. The wiring extending direction of the wiring region 111-x1 and the wiring extending direction of the wiring region 111-x2 have substantially the same angle Φa (that is, an angle of the included angle θ$_{x1-1}$ is the same as an angle of the included angle θ$_{x1-2}$, which means |θ$_{x1-1}$|=|θ$_{x1-2}$|=Φa) and the same directions (where the included angles θ$_{x1-1}$ and θ$_{x1-2}$ are both positive). The wiring extending direction of the wiring region 111-x3 and the wiring extending direction of the wiring region 111-x4 have substantially the same angle Φb (that is, an angle of the included angle θ$_{x1-3}$ is the same as an angle of the included angle θ$_{x1-4}$, which means |θ$_{x1-3}$|=|θ$_{x1-4}$|=Φb) and the same directions (where the included angles θ$_{x1-3}$ and θ$_{x1-4}$ are negative). Besides, the included angles of the wiring extending directions of the wiring regions 110 contained in gate line region GL1 are repeated periodically in an order of θ$_{x1-1}$, θ$_{x1-1}$, θ$_{x1-3}$ and θ$_{x1-3}$, along the x-direction. The wiring extending direction of the wiring regions 110 contained in the same gate line region GL are periodically repeated every four wiring regions as a cycle.

On the other hand, in data line region DL1, Φc=|θy$_{1-1}$| and Φd=|θy$_{1-3}$|. The wiring extending direction of the wiring region 111-y1 and the wiring extending direction of the wiring region 111-y2 have substantially the same angle Φc (that is, an angle of the included angle θ$_{y1-1}$ is the same as an angle of the included angle θ$_{y1-2}$, which means |θ$_{y1-1}$|=|θ$_{y1-2}$|=Φc) and the same directions (where the included angles θ$_{y1-1}$ and θ$_{y1-2}$ are both negative). The wiring extending direction of the wiring region 111-y3 and the wiring extending direction of the wiring region (not shown in FIG. 10B), arranged in sequence after wiring region 111-y3 along the data line region DL1, have substantially the same angle Φd and the same direction which is positive. Besides, the included angles of the wiring extending directions of the wiring regions 110 contained in data line region DL1 are repeated periodically in an order of θ$_{y1-1}$, θ$_{y1-1}$, θ$_{y1-3}$ and θ$_{y1-3}$, along the y-direction. The wiring extending direction of the wiring regions 110 contained in the same gate line region GL are periodically repeated every four wiring regions as a cycle.

Although FIGS. 10A and 10B illustrates that the included angles of the wiring extending directions of the wiring regions 110 in each of the gate line regions are repeated periodically in an order of +Φa, +Φa, −Φb and −Φb, along the x-direction and the included angles of the wiring extending directions of the wiring regions 110 in each of the data line regions are repeated periodically in an order of −Φc, −Φc, +Φd and +Φd, along the y-direction, but it is not limited and can be adjusted by design. For example, some gate line regions/data line regions can be arranged as the manner depicted in FIG. 10A and some other gate line regions/data line regions can be arranged as the manner depicted in FIG. 7A or FIG. 8A or FIG. 9A.

In FIGS. 10A and 10B, two adjacent gate line regions GL are symmetrical about each other, and two adjacent data line regions DL are symmetrical about each other, but not limited thereto. It is appreciated that any one of the gate line regions GL/data line region DL can either have the same wiring extending direction, opposite wiring extending direction or shift wiring extending direction relative to its adjacent gate line region GL/data line region DL.

Figure 11A:
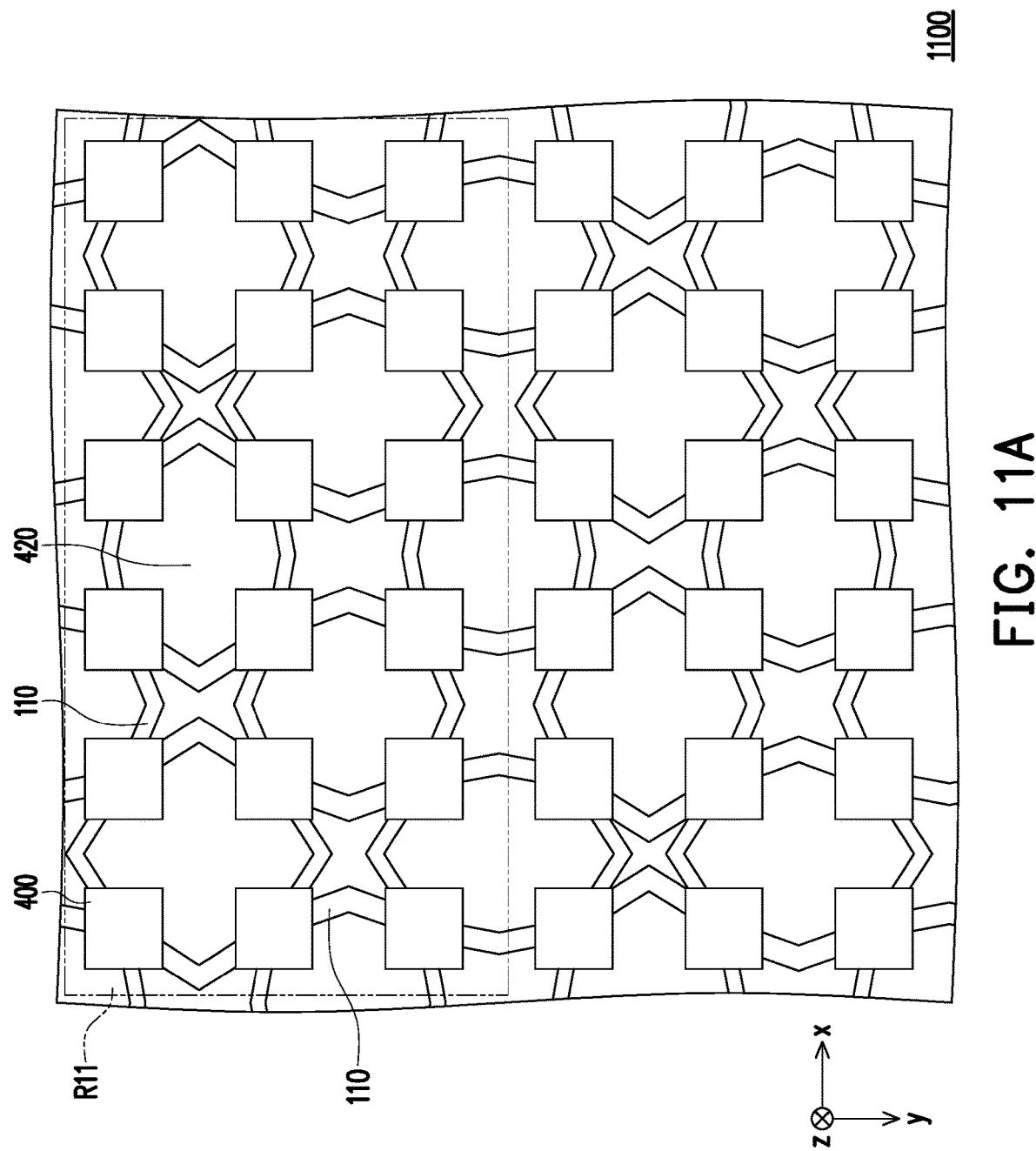
FIG. 11A is a schematic top view of a display panel according to an embodiment of the invention.
Figure 11B:
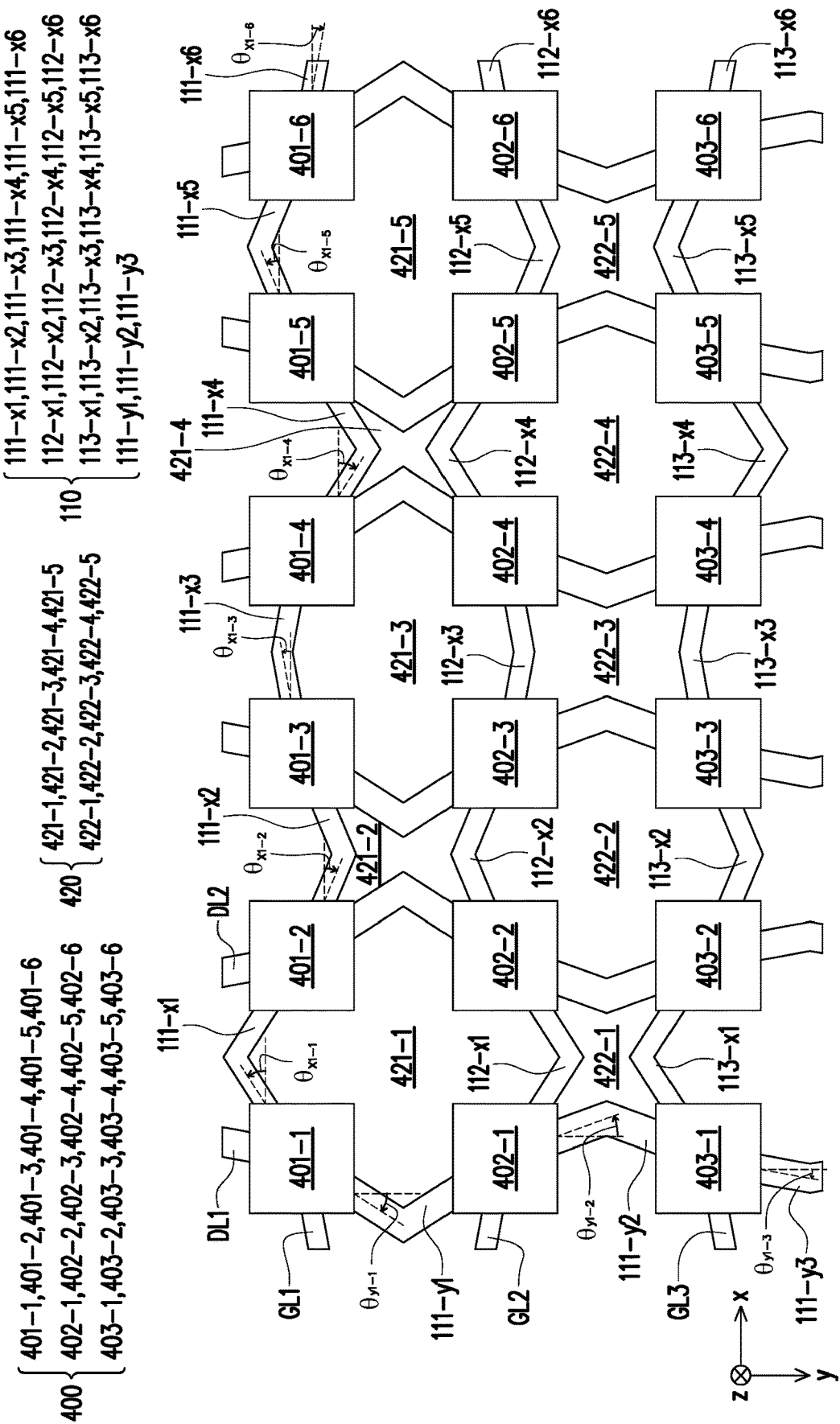
FIG. 11B is a partial enlarged schematic top view of the display panel of FIG. 11A.

FIG. 11A is a schematic top view of a display panel according to an embodiment of the invention. FIG. 11B is a partial enlarged schematic top view of a region R11 of the display panel of FIG. 11A. It should be mentioned here that, the embodiment of FIG. 11A and FIG. 11B adopts the reference numerals and a portion of the content of the embodiment of FIG. 7A and FIG. 7B, wherein the same or similar elements are denoted by the same or similar reference numerals, and the description of the same technical content is omitted. For the description of the omitted portion, reference may be made to the above embodiments, which is not repeated herein.

Referring to FIG. 11A and FIG. 11B, the display panel 1110 in the present embodiment is similar to the display panel 70 in FIGS. 7A and 7B. Different from the display panel 70, in the present embodiment, angles of included angles of wiring extending directions of three adjacent wiring regions contained in the same gate line region GL or the same data line region DL are different from each other, at least one of the included angles of the wiring extending directions of the three adjacent wiring regions contained in the same gate line region GL or the same data line region DL is positive and at least one of the included angles of the wiring extending directions of the three adjacent wiring regions contained in the same gate line region GL or the same data line region DL is negative. For example, the wiring regions 111-x1, 111-x2, and 111-x3 are contained in the gate line region GL1, the angle of the included angle θ$_{x1-1}$, the angle of the included angle θ$_{x1-2}$ and the angle of the included angle θ$_{x1-3}$ are different, as well as the included angles θ$_{x1-1}$ and θ$_{x1-3}$ are positive, and the included angle θ$_{x1-2}$ is negative. On the other hand, the wiring regions 111-y1, 111-y2, and 111-y3 are contained in the data line region DL1, the angle of the included angle θ$_{y1-1}$, the angle of the included angle θ$_{y1-2}$ and the angle of the included angle θ$_{y1-3}$ are different, as well as the included angles θ$_{y1-1}$ and θ$_{y1-3}$ are negative, and the included angle θ$_{y1-2}$ is positive. In this way, the diffraction of high-frequency terms can be further dispersed and thus the diffraction intensity of high-frequency terms can be reduced to prevent image distortion, such that the image quality of the display panel 1100 is improved.

In some embodiments, the angles of the included angles (that is, absolute values of the include angles) of the wiring extending direction of the wiring regions 110 contained in the same gate line region GL are periodically repeated in an order of |θ$_{x1-1}$|, |θ$_{x1-2}$| and |θ$_{x1-3}$| in the x-direction. That is to say, the angle of the included angle θ$_{x1-4}$ is substantially the same as the angle of the included angle θ$_{x1-1}$, the angle of the included angle θ$_{x1-5}$ is substantially the same as the angle of the included angle θ$_{x1-2}$ and the angle of the included angle θ$_{x1-6}$ is substantially the same as the angle of the included angle θ$_{x1-3}$.

In some embodiments, the angles of the included angles of the wiring extending direction of the wiring regions 110 contained in the same data line region DL are periodically repeated in |σ$_{y1-1}$|, |θ$_{y1-2}$| and |θ$_{y1-3}$| in the y-direction.

In the present application, the signs of the included angle of the wiring extending direction of the wiring regions contained in the same gate line region GL or the same data line region DL are in an alternating positive and negative configuration, but it is not limited, as long as at least one of the included angles of the wiring extending directions of the three adjacent wiring regions contained in the same gate line region GL (such as θ$_{x1-1}$, θ$_{x1-2}$ and θ$_{x1-3}$) or the same data line region DL (such as θ$_{y1-1}$, θ$_{y1-2}$ and θ$_{y1-3}$) is positive and at least one of the included angles of the wiring extending directions of the three adjacent wiring regions contained in the same gate line region GL (such as $\theta_{x1-1}$, $\theta_{x1-2}$ and $\theta_{x1-3}$) or the same data line region DL (such as $\theta_{y1-1}$, $\theta_{y1-2}$ and $\theta_{y1-3}$) is negative. In other embodiments, the signs of the included angle of the wiring extending direction of the wiring regions contained in the same gate line region GL or the same data line region DL are periodically repeated in an order of positive, positive and negative configuration, or vice versa (that is, in an order of negative, negative and positive configuration). For example, the included angles $\theta_{x1-1}$, $\theta_{x1-2}$, $\theta_{x1-4}$ and $\theta_{x1-5}$ may be positive, and the included angles $\theta_{x1-3}$ and $\theta_{x1-6}$ may be negative; and the included angles $\theta_{y1-1}$ and $\theta_{y1-2}$ may be negative, and the included angle $\theta_{y1-3}$ may be positive. In the present embodiments, the wiring extending direction of the wiring regions 110 contained in the same gate line region GL or the same data line region DL are periodically repeated every six wiring regions as a cycle.

In FIG. 11A, two adjacent gate line regions GL are symmetrical about each other, and two adjacent data line regions DL are symmetrical about each other. Therefore, the angles of the included angles with the x-direction of the wiring extending directions of the two adjacent and corresponding wiring regions located at the adjacent gate line regions GL respectively are the same, and the signs of the included angles with the x-direction of the wiring extending directions of the two adjacent and corresponding wiring regions located at the adjacent gate line regions GL respectively are opposite. That is, the product of the included angles with the x-direction of the wiring extending directions of the two adjacent and corresponding wiring regions located at the adjacent gate line regions GL respectively is a negative value. On the other hand, the angles of the included angles with the y-direction of the wiring extending directions of the two adjacent and corresponding wiring regions located at the adjacent data line regions DL respectively are the same, and the signs of the included angles with the y-direction of the wiring extending directions of the two adjacent and corresponding wiring regions located at the adjacent data line regions DL respectively are opposite. That is, the product of the included angles with the y-direction of the wiring extending directions of the two adjacent and corresponding wiring regions located at the adjacent data line regions DL respectively is a negative value. However, in other embodiments, two adjacent gate line regions GL may not be symmetrical about each other or two adjacent data line regions DL may not be symmetrical about each other, which is not limited. It is appreciated that any one of the gate line regions GL/data line region DL can either have the same wiring extending direction, opposite wiring extending direction or shift wiring extending direction relative to its adjacent gate line region GL/data line region DL. It is appreciated that the driving electrode region 400 in FIGS. 7A-7B, 8A-8B, 9, 10A-10B and 11A-11B is not limited to the driving electrode region 400 described in related with FIG. 4B. In other embodiments, the driving electrode region 400 in FIGS. 7A-7B, 8A-8B, 9, 10A-10B and 11A-11B can also refer to the driving electrode region (such as driving electrode regions 100, 500, 600 and etc.) mentioned in other embodiments.

Based on the above, in the display panel of the invention, the included angles of the wiring extending directions of the wiring regions between adjacent driving electrode regions and the arrangement directions thereof are arranged in a positive and negative alternate configuration in the arrangement directions to effectively reduce the diffraction intensity of first-order diffraction and high-frequency terms, thereby improving the image quality of the display panel.

What is claimed is:

1. A display panel, comprising:
   a plurality of driving electrode regions; and
   a plurality of wiring regions connected between the driving electrode regions,
   wherein a (2n−1)th driving electrode region, a (2n)th driving electrode region, a (2n+1)th driving electrode region and a (2n+2)th driving electrode region are arranged in sequence along an arrangement direction, a (2n−1)th wiring region extended from the (2n−1)th driving electrode region toward the (2n)th driving electrode region has a wiring extending direction forming a first included angle with the arrangement direction, a (2n)th wiring region extended from the (2n)th driving electrode region toward the (2n+1)th driving electrode region has a wiring extending direction forming a second included angle with the arrangement direction, and a (2n+1)th wiring region extended from the (2n+1)th driving electrode region toward the (2n+2)th driving electrode region has a wiring extending direction forming a third included angle with the arrangement direction, wherein n is a positive integer,
   wherein at least one of the first included angle, the second included angle and the third included angle is positive and at least one of the first included angle, the second included angle and the third included angle is negative,
   wherein an angle of the first included angle is different from an angle of the second included angle,
   wherein angles of the first included angle, the second included angle and the third included angle are respectively 5 degrees to 44 degrees.

2. The display panel of claim 1, wherein the (2n−1)th wiring region and the (2n)th wiring region are respectively located on two opposite sides of straight connecting lines of the (2n−1)th driving electrode region, the (2n)th driving electrode region, and the (2n+1)th driving electrode region.

3. The display panel of claim 1, wherein each of the wiring regions comprises a plurality of segments, and two adjacent segments have different extending directions.

4. The display panel of claim 1, wherein each of the wiring regions is first extended from one of the driving electrode regions along a first direction and then extended along a second direction toward the next driving electrode region, and the first direction is intersected with the second direction.

5. The display panel of claim 1, wherein the driving electrode regions and the wiring regions have an average optical transmittance of less than 10%.

6. The display panel of claim 1, wherein the driving electrode regions and the wiring regions enclose a plurality of transmission regions, and two adjacent transmission regions arranged along the arrangement direction have different geometric shapes.

7. The display panel of claim 6, wherein an average optical transmittance of the transmission regions is 10% to 99%.

8. The display panel of claim 1, further comprising a plurality of pixel units, wherein the pixel units are respectively disposed in the driving electrode regions.

9. The display panel of claim 8, wherein each of the pixel units comprises a plurality of light-emitting units and a pixel circuit element.

10. The display panel of claim 9, further comprising:
    a display medium, wherein each of the pixel units further comprises a plurality of pixel electrodes, wherein the pixel electrodes are electrically connected to the pixel circuit elements, and the display medium is adapted to be driven by the pixel units.

11. The display panel of claim 1, wherein the angles of the first included angle, the second included angle and the third included angle are different from each other.

12. The display panel of claim 1, wherein two of the first included angle, the second included angle and the third included angle have the same angle.

13. The display panel of claim 1, wherein the first included angle and the second included angle have the same sign, and a sign of the third included angle is opposite to the first included angle.

14. The display panel of claim 1, wherein the arrangement direction comprises an x-direction or a y-direction intersecting the x-direction, the plurality of driving electrode regions arranged along the x-direction and the y-direction to form a periodic array, and each of the plurality of wiring regions between the plurality of driving electrode regions has a wiring extending direction forming an included angle with the arrangement direction,
   wherein a portion of the plurality of wiring regions constitutes a plurality of gate line regions and the other portion of the plurality of wiring regions constitutes a plurality of data line regions,
   wherein the plurality of gate line regions are arranged in the y-direction and extends along the x-direction as its main extending direction, and
   wherein the plurality of data line regions are arranged in the x-direction and extends along the y-direction as its main extending direction.

15. The display panel of claim 14, wherein adjacent gate line regions are symmetrical about an axis.

16. The display panel of claim 14, wherein at least one of the plurality of gate line regions are shifted a driving electrode region pitch relative to its adjacent gate line region, wherein the driving electrode region pitch is defined as a distance between centers of two adjacent driving electrode regions.

17. The display panel of claim 14, wherein signs of the included angles with the x-direction of the wiring extending directions of the wiring regions contained in the same gate line region are repeated periodically in positive and negative configuration, in positive, positive and negative configuration, in negative, negative and positive configuration or in positive, positive, negative and negative configuration, and
   signs of the included angles with the y-direction of the wiring extending directions of the wiring regions contained in the same data line region are repeated periodically in positive and negative configuration, in positive, positive and negative configuration, in negative, negative and positive configuration or in positive, positive, negative and negative configuration.

18. The display panel of claim 14, wherein the wiring extending direction of the wiring regions contained in the same gate line region or the same data line region are periodically repeated.

19. The display panel of claim 1, wherein the arrangement direction is defined as an extension direction of the shortest connection line between two adjacent driving electrode regions.

* * * * *

UNITED STATES PATENT AND TRADEMARK OFFICE
CERTIFICATE OF CORRECTION

| | | |
|---|---|---|
| PATENT NO. | : 12,136,379 B2 | Page 1 of 1 |
| APPLICATION NO. | : 18/349184 | |
| DATED | : November 5, 2024 | |
| INVENTOR(S) | : Chun-Yu Lin et al. | |

It is certified that error appears in the above-identified patent and that said Letters Patent is hereby corrected as shown below:

On the Title Page

Item (72) Inventor is corrected to read:
--Chun-Yu Lin, Hsinchu (TW);
Kun-Cheng Tien, Hsinchu (TW);
Jia-Long Wu, Hsinchu (TW);
Yu Tang Tsai, Hsinchu (TW);
Rong-Fu Lin, Hsinchu (TW);
Shu-Hao Huang, Hsinchu (TW)--.

Signed and Sealed this
Seventeenth Day of June, 2025

Coke Morgan Stewart
*Acting Director of the United States Patent and Trademark Office*